US007659009B2

(12) United States Patent
Li et al.

(10) Patent No.: US 7,659,009 B2
(45) Date of Patent: Feb. 9, 2010

(54) THERMALLY CROSSLINKABLE MATERIALS AND MULTI-LAYERED DEVICES THEREFROM

(75) Inventors: Yuning Li, Mississauga (CA); Jianfu Ding, Ottawa (CA); Michael Day, Orleans (CA); Ye Tao, Ottawa (CA); Marie D'Iorio, Gloucester (CA)

(73) Assignee: National Research Council of Canada, Ottawa, ON (CA)

( * ) Notice: Subject to any disclaimer, the term of this patent is extended or adjusted under 35 U.S.C. 154(b) by 559 days.

(21) Appl. No.: 10/534,087

(22) PCT Filed: Nov. 7, 2003

(86) PCT No.: PCT/CA03/01696

§ 371 (c)(1),
(2), (4) Date: Jan. 20, 2006

(87) PCT Pub. No.: WO2004/041962

PCT Pub. Date: May 21, 2004

(65) Prior Publication Data

US 2006/0166035 A1    Jul. 27, 2006

Related U.S. Application Data

(60) Provisional application No. 60/424,699, filed on Nov. 8, 2002, provisional application No. 60/439,811, filed on Jan. 14, 2003.

(51) Int. Cl.
*H01L 51/54* (2006.01)
*C09K 11/00* (2006.01)
*C09K 11/06* (2006.01)

(52) U.S. Cl. .............. 428/690; 428/917; 313/504; 313/506; 568/3; 257/40; 257/E51.032; 252/301.16; 546/13

(58) Field of Classification Search .............. 428/690, 428/917; 313/504, 506; 257/40, E51.044; 546/13; 568/1, 3, 5, 6; 528/4, 5, 6, 7, 8, 528/394
See application file for complete search history.

(56) References Cited

U.S. PATENT DOCUMENTS

| 5,055,366 | A  | * | 10/1991 | Yu et al. | ............... | 430/58.8 |
| 6,268,072 | B1 | * | 7/2001  | Zheng et al. | ............... | 428/690 |
| 6,309,763 | B1 | * | 10/2001 | Woo et al. | ............... | 428/690 |
| 2003/0072943 | A1 | * | 4/2003 | Anderson et al. | ........ | 428/411.1 |

OTHER PUBLICATIONS

Snyder et al. "Aryl boronic acids. II. Aryl boronic anhydrides and their amine complexes." J. Am. Chem. Soc. 1958, vol. 80, No. 14, pp. 3611-3615.*

* cited by examiner

*Primary Examiner*—D. Lawrence Tarazano
*Assistant Examiner*—Michael Wilson
(74) *Attorney, Agent, or Firm*—J. Wayne Anderson

(57) ABSTRACT

The invention disclosed relates to cross-linkable composites of boronic acid or a boronic acid derivative such as a boronate, and an organic or organo-metallic moiety having a functionality such as hole transporting, electron transporting and light emitting, to cross-linked composites and to methods for making same. Multi-layer materials and optoelectronic devices including such cross-linked composites are also disclosed.

17 Claims, 21 Drawing Sheets n = or >1;
R = organic or organometallic complex moiety including oligomer and polymer.

(CzBA)

N = 2, 3, and 4
(F$_n$BA)

(Alq$_3$BA)

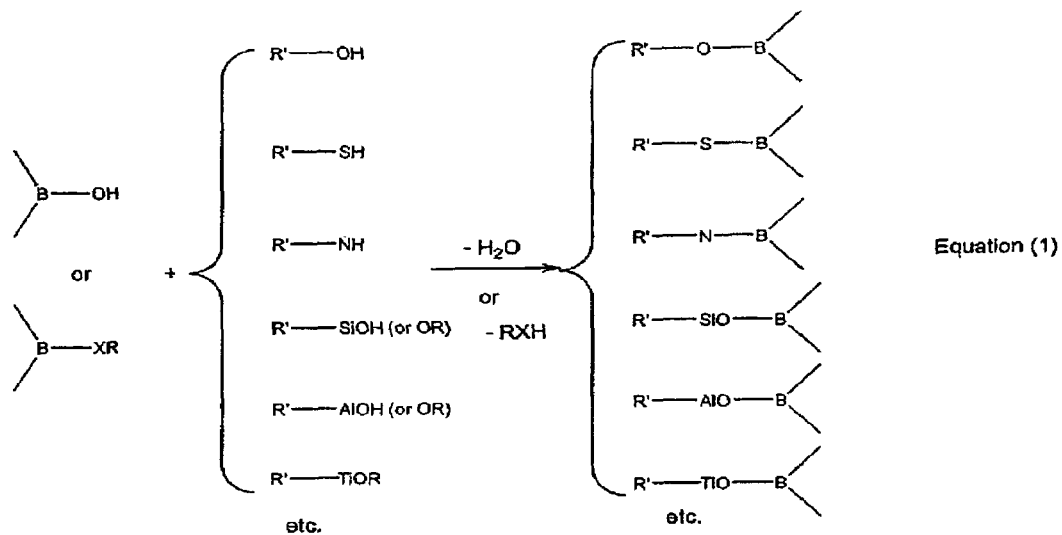

wherein, X = O, S, N; R and R' = alkyl, aryl, or any other organic and inorganic structures or groups.

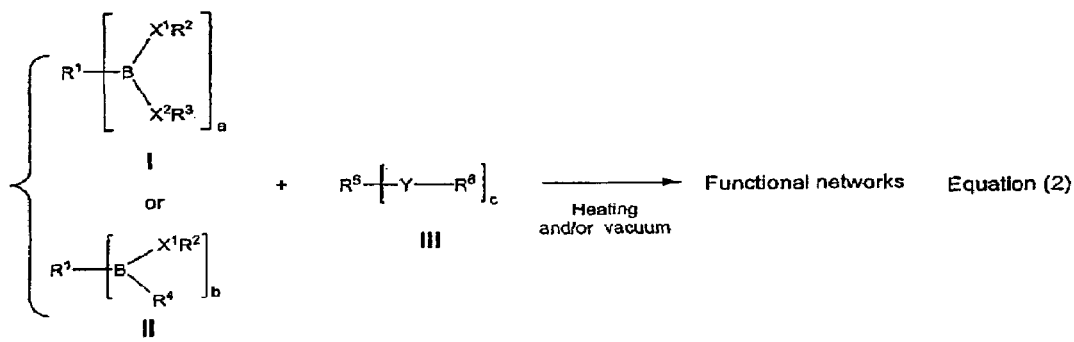

wherein,
$R^1$, $R^4$, and $R^5$ = alkyl, aryl, or other groups, either organic or inorganic, but at least one of them contains functionality; they can be of small molecular weights or high molecular weights.
$R^2$, $R^3$, $R^6$ = H, alkyl, aryl, they may be same or different, but at least one of them is H.
$X^1$, $X^2$ = O, S, or N, they may be same or different.
Y = O, S, N (or NH), SiO, AlO, TiO, etc.
a, b, c are equal to or larger than one, but at least either a (or b) or c is larger than one.

Fig. 10

THERMALLY CROSSLINKABLE MATERIALS AND MULTI-LAYERED DEVICES THEREFROM

This application is a National Stage application of PCT Application PCT/CA2003/001696 filed 7 Nov. 2003 which claims benefit of U.S. Provisional Application No. 60/424,699 filed 8 Nov. 2002 and U.S. Provisional Application No. 60/439,811 filed 14 Jan. 2003.

BACKGROUND OF THE INVENTION

This invention relates to composites of boronic acid or derivatives thereof, such as boronates, and an organic or organometallic moiety including a functional group, which when cross-linked can be used as individual layers in multi-layer opto-electronic devices, such as light emitting devices.

Many organic or polymeric optic, electronic and optoelctronic devices, such as light-emitting diodes (LEDs), field-effect transistors (FETs), solar cells, optical waveguides, etc., require high quality organic multi-layered configurations to optimise their performance.[1-3]

In the fabrication of organic or polymeric light emitting devices it is advantageous to incorporate multi-layered structured materials with special functions into different location within the device. For instance, organic or polymer light-emitting diodes (LEDs) with a stack of hole-transporting, electron-transporting, and light-emitting layers exhibit enhanced device efficiency, higher brightness, and better stability. Solvent-based or wet-processing techniques such as reel-to-reel printing, screen-printing or spin-coating are important fabrication techniques that could significantly reduce fabrication costs of organic/polymer devices. However, the fabrication of multi-layer device structure is often difficult with wet-processing techniques. One typical problem of making multi-layered structures using solutions is the fact that the solvent used for each successive layer can lead to swelling or dissolution of underlying layers.

In addition, in the case of some polymeric materials, it has been found when they are used in applications such as light-emitting diodes aggregation and excimer formation can occur which can cause poor optical stability in the fabricated devices.[4] For example, upon heating, or on passage of an electrical current through a polyfluorene based polymer, the formation of a long wavelength emission is frequently observed in the region 500-600 nm which can cause a drastic drop in the emission efficiency.[5]

(A) Multi-layer devices, are currently being fabricated using the following methods:

(i) For low molecular weight organic materials, vacuum deposition is usually used for making a multi-layered device structure.

(ii) Since a multi-layered device structure is advantageous in highly efficient polymer based devices, much research effort has been devoted to this area. Researchers have developed different strategies to fabricate multi-layered PLED structures using 1) polymer materials with very different solubilities for the different layers in a multi-layered structure, 2) plastic lamination processes or cross-linkable polymer layers, as well as 3) chemical vapor deposition to avoid the use of solvents. Bernius et al.[6] reported the use of fluorene triphenylamine copolymers with carboxylic acid substituents for the hole-transport layer, as these are soluble in polar solvents like DMF, but practically insoluble in aromatic hydrocarbons such as toluene and xylene. An electron-transport and emitting fluorene polymer layer was then spin-coated on top of this layer using a xylene solution. A double layer structure with sharp polymer-polymer interface was successfully produced using this method. Hay et al. have developed a new series of arylamine-based hole-transport polymer[7,8] that can only be dissolved in some organic solvents such as chloroform, for use in the fabrication of double layer PLEDs. By using electron transporting polymers that are soluble in toluene, double layered polymer blue light emitting devices have been successfully fabricated [9]. Yang and his co-workers[10] recently reported a low temperature lamination method using a template activated surface process' to fabricate high performance double layer blue and red-emitting PLEDs at a temperatures much lower than the $T_g$ of the polymers used in their devices. The discovery of cross-linkable oligo- and poly(dialkylfluorene)s series[11-13] certainly opened the door for multi-layer PLED fabrication using solution processable and thermally cross-linkable polymeric or oligomeric materials. As an alternative approach for making multi-layered polymer devices, Murata[14] recently reported a two-layered polymer light emitting device prepared by a vapor deposition polymerization process, which has the advantage of using a solvent-free fabrication environment to produce a good thin film with consistency in uniformity, and minimum contamination. Unfortunately the fabrication costs associated with this process are a problem. In addition it the vapor phase polycondensation reaction used in this process may be difficult to apply to other polymer systems.

(B) In terms of the problems associated with aggregation and excimer formation, several approaches[16-18] have been proposed to stabilise the optical properties of polymers used in light-emitting materials. These include:

(i) Incorporation of bulky substituents into the polymer backbone or at the chain ends to enlarge the intermolecular distance.

(ii) Copolymerization with other monomers to hamper chain alignment.

(iii) Introduction of spiro-structures to decrease the crystallization tendency.

(iv) Thermal-crosslinking of precursor oligomers via styryl chain end groups to form amorphous networks.

Although the vacuum deposition is a very good technique for the fabrication of multi-layered device structure, it is limited to low molecular weight organic materials and because of the use of a high vacuum system, the production costs will be higher than using solvent-based wet processing techniques. Another possible disadvantage is that crystallization of the organic thin films may occur upon heating or operation, which could cause device failure.

The use of crosslinkable polymeric materials meanwhile through spin-coating, solution-casting, or dip-coating requires the attachment of crosslinkable functionalities to the polymers. This can complicate the synthetic procedure and needs to be optimised in terms of crosslink content and crosslinking conditions. In addition, in many cases thermal or photo initiators are necessary for the crosslinking reactions to occur. These initiators can give rise to very reactive radicals, which have the potential of altering the materials' chemical structure, which can result in defects, which may be detrimental to the device's performance and lifetime. In addition the presence of initiator residues can contaminate the materials.

From a chemical structural point of view it should also be noted that while the approaches listed in section (B) i), ii), and iii) may result in some improvements in the optical stability, these techniques have so far not resulted in the complete suppression of aggregation. On the other hand while an approach such as (B), iv) could be used to obtain materials with good colour stability, the method does require a relatively high processing temperature (~200° C.) to initiate the crosslinking reaction. In addition, because the reaction involves the formation of very reactive radicals, changes to the polymer backbone are possible which can result in structural defects that are detrimental to the materials' stability and influence other components (e.g., charge-transporting layers).

It is also known that organoboronic acids undergo self-condensation (dehydration) reactions under vacuum or/and heating to form trialkyl-(or triaryl-) boroxine structures.[4-6]

Therefore, the use of di- or multi-organoboronic acids, can lead to the formation of cross-linked networks.[6]

SUMMARY OF THE INVENTION

According to one aspect of the invention, a cross-linkable composite of boronic acid or a boronic acid derivative such as a boronate, and an organic or organo-metallic moiety having a functionality such as hole transporting, electron transporting and light emitting, is provided.

According to another aspect of the invention, a method is provided for making a cross-linkable composite of boronic acid or a boronic acid derivative derivative such as a boronate, and an organic or organo-metallic moiety having a functionality such as hole transporting, electron transporting and light emitting, comprising attaching to boronic acid or a boronic acid derivative, an organic or organo-metallic moiety having a functionality such as hole transporting, electron transporting and light emitting.

According to yet another aspect of the invention, a cross-linked composite of boronic acid or a boronic acid derivative such as a boronate, and an organic or organo-metallic moiety having a functionality such as hole transporting, electron transporting and light emitting, is provided.

According to an embodiment of this aspect of the invention, the boronic acid or boronic acid derivative is selected from the group consisting of a) a single boronic acid, b) a composite of two or more different boronic acids, c) a composite of one boronic acid or its derivative with one or more other materials which contain groups reactive with boronic acid or its derivative, and d) a composite of any number of boronic acids or its derivatives (at least one) with any number and any kinds of other materials which contain groups listed in the formulas at FIG. 10, reactive with boronic acid or its derivative.

According to a further aspect of the invention, a method is provided for making a cross-linked composite of boronic acid or a boronic acid derivative such as a boronate, and an organic or organo-metallic moiety having a functionality such as hole transporting, electron transporting and light emitting, comprising attaching to boronic acid or a boronic acid derivative, an organic or organo-metallic moiety having a functionality such as hole transporting, electron transporting and light emitting, and cross-linking.

According to an embodiment of this aspect of the invention, the boronic acid or boronic acid derivative is selected from the group consisting of a) a single boronic acid, b) a composite of two or more different boronic acids, c) a composite of one boronic acid or its derivative with one or more other materials which contain groups reactive with boronic acid or its derivative, and d) a composite of any number of boronic acids or its derivatives (at least one) with any number and any kinds of other materials which contain groups listed in the formulas at FIG. 10, reactive with boronic acid or its derivative.

According to a yet further aspect of the invention, a multi-layer material is provided, comprising a plurality of layers of a cross-linked composite of boronic acid or a boronic acid derivative such as a boronate, and an organic or organo-metallic moiety having a functionality such as hole transporting, electron transporting and light emitting, wherein each layer has a different functionality.

According to a further aspect of the invention, a method is provided for making a multi-layer material comprising a plurality of layers of a cross-linked composite of boronic acid or a boronic acid derivative such as a boronate, and an organic or organo-metallic moiety having a functionality such as hole transporting, electron transporting and light emitting, the method comprising forming on a substrate, a layer of a composite of boronic acid or a boronic acid derivative and an organic or organo-metallic moiety having a functionality such as hole transporting, electron transporting and light emitting, and cross-linking, and forming at least one another such layer having a different functionality such as hole transporting, electron transporting and light emitting and crosslinking.

According, to a further aspect of the invention, a multi-layer optoelectronic device, such as an OLED, is provided, comprising in sequence, a transparent substrate layer, a transparent electrode layer, a layer of a cross-linked composite of boronic acid or a boronic acid derivative such as a boronate, and an organic or organo-metallic moiety having a functionality such as hole transporting, electron transporting and light emitting, at least one another such layer having a different functionality such as hole transporting, electron transporting and light emitting, and another transparent electrode layer.

According to another aspect of the invention, if the organic or organometallic moiety of the boronic acid is a functional group, such as, an electron-withdrawing, electron-donating, or light-emitting group, then the resulting network materials could be used as charge-transporting or light-emitting layers in LED's or other electronic or optoelectronic devices.

According to yet another aspect of the invention, a method is provided for the esterification of boronic acids and the transesterification of boronates with alcohols or thiols to form a cross-linkable functional material intermediate, that can readily be cross-linked e.g. by heating, to form multi-layer (light-emitting layers and charge-transporting layers) useful for the production of various electronic components e.g. light-emitting diodes (LEDs), and other electronic and optoelectronic devices.

According to yet another aspect of the invention a method of making cross-linked functional networks is provided, comprising reacting compound of structural formula I or structural formula II with a compound of structural formula III (as shown in FIG. 10), and cross-linking Equation (1)

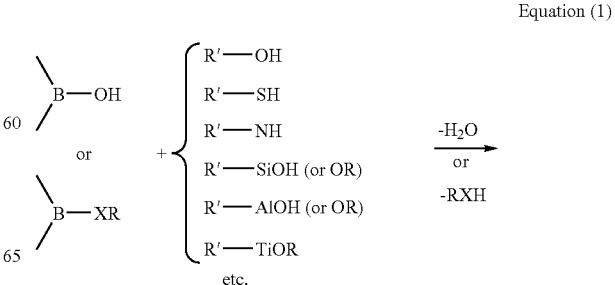

-continued

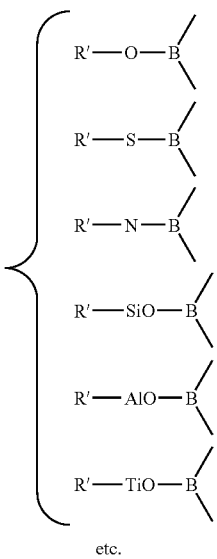

etc.

wherein, X=O, S, N; R and R'=alkyl, aryl, or any other organic and inorganic structures or groups.

Equation (2)

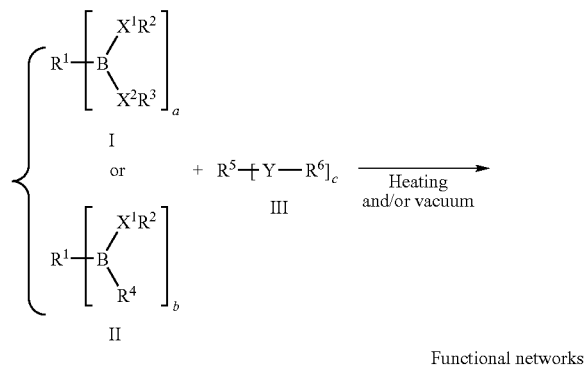

Functional networks wherein, $R^1$, $R^4$, and $R^5$=alkyl, aryl, or other groups, either organic or inorganic, but at least one of them contains functionality; they can be of small molecular weights or high molecular weights.

$R^2$, $R^3$, $R^6$=H, alkyl, aryl, they may be same or different, but at least one of them is H.

$X^1$, $X^2$=O, S, or N, they may be same or different.

Y=O, S, N (or NH), SiO, AlO, TiO, etc.

a, b, c are equal to or larger than one, but at least either a (or b) or c is larger than one.

According to yet another aspect of the invention a cross-linked functional network is provided, made by the method described in the preceding paragraph.

BRIEF DESCRIPTION OF THE DRAWING

FIG. 10 is a schematic illustration of cross-linking reactions of boronic acids or boronates with other components, according to the invention.

DETAILED DESCRIPTION OF THE INVENTION

Figure 1:
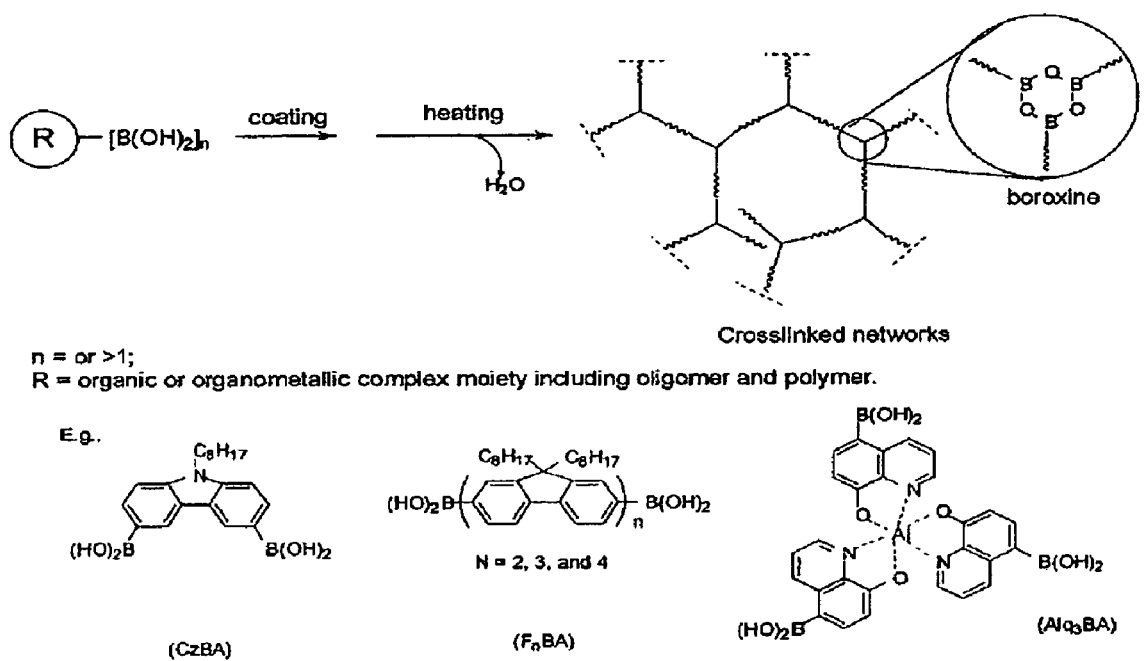
FIG. 1 is a schematic illustration of a reaction scheme of a process according to the invention starting from boronic acid.

As described in FIG. 1, we have attached organoboronic acids to variety of molecules with very different functions, such as hole transporting, electron transporting and light emitting. After undergoing the self-condensation heating process, the molecules will be cross-linked via the organoboronic groups to form the illustrated boroxine structures. These modified composite materials can be used either as individual layers in multi-layer devices, or be used to produce new composite materials by simply mixing molecules with different functionalities followed by cross-linking in a single layer, e.g. cross-linking molecules with hole-transport moiety and electron transport moiety in right ratio will render the composite material better charge transport properties.

In this invention, we demonstrated the use of organoboronic acids as cross-linking end groups (or side groups) to immobilize the functional materials in a thin film for multi-layer device fabrication. A double layer organic light emitting diode from CzBA and $F_3BA$ (FIG. 4(a)) has been fabricated as a testing device to demonstrate that a multi-layered device structure can be easily realized using materials containing organoboronic acid groups. Since the OLED shown here was only used as a demonstration, we expect this film processing technique (using organoboronic acid groups as end caps) can be applied to the fabrication of photovoltaic cells, photonic multi-layer structures, and any other organic electronic/optical devices which require a multi-layered structure.

In this invention (see FIG. 4), the multi-layer structure consists of a glass substrate or any transparent substrate. The second layer is a transparent electrode, indium tin oxide (ITO) anode, as an example. The third layer is a transparent hole transporting layer, CzBA, as an example, then a transparent light emissive layer, F3 BA, as an example, was used in the device, which also functions as a electron-transporting layer, and finally followed by a second electrode, Mg:Ag cathode in this case.

Procedure (Double-Layer Device as an Example):

1. ITO coated glass substrates were patterned using conventional photolithography and wet chemical etching. The pixel size is 5 mm×5 mm. Thin films and double layer structure were prepared as described below.

2. The CzBA thin films were spin-coated onto plasma treated ITO from a THF solution (20 mg CzBA/ml) at 1500 rpm for 50 sec. The CzBA films prepared under this condition are about 110-120 nm thick. Films were heated in a vacuum oven at 130° C. for two hours to complete the cross-linking reaction (the film could be crosslinked at room temperature-130° C. according the chemical property of this boronic acid). No thickness change was observed after the heat treatment (within 10% of accuracy).

3. Then the $F_3BA$ layer was spin-coated on the top of cross-linked CzBA layer from a THF solution (20 mg $F_3BA$/ml), at 1500 rpm for 50 sec. The $F_3BA$ films prepared under this condition are about 120-130 nm thick, which were measured on separated ITO-glass substrates. Films were heated in a vacuum oven at 130° C. for two hours to complete the cross-linking reaction. The total thickness of the resulted double layer structure was 250 nm, that is equal to the sum of the thickness of individual CzBA and $F_3BA$ layers prepared on separated ITO-glass substrates. This indicates strongly that the CzBA layer sustains during the coating of the F3BA layer.

4. Mg:Ag (10:1) alloy electrode was prepared under high vacuum by co-evaporating Mg and Ag metals.

Results and Discussion

Figure 2:
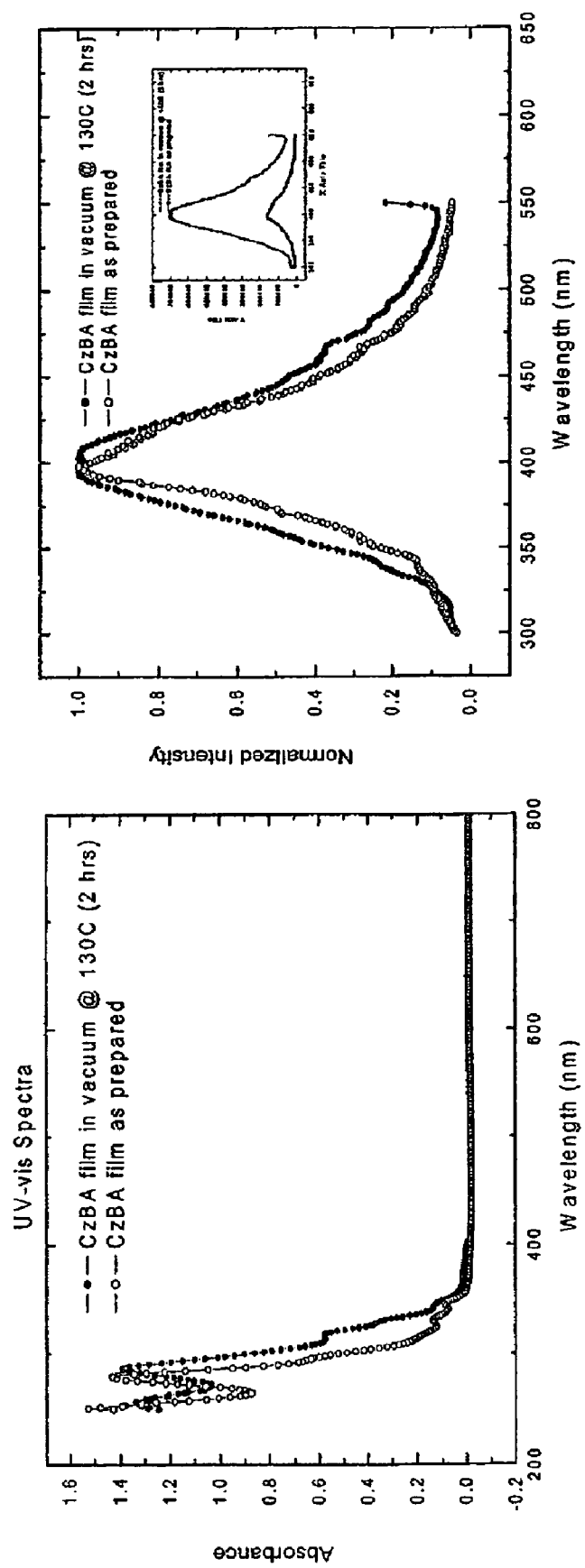
FIG. 2 is the UV-vis and fluorescence spectra for CzBA thin films.

Stability of photoluminescence upon heating:

Upon heating in a vacuum oven at 130° C. for two hours, the CzBA thin films only show slight red shifts in the UV-vis and fluorescence spectra (FIG. 2).

Figure 3:
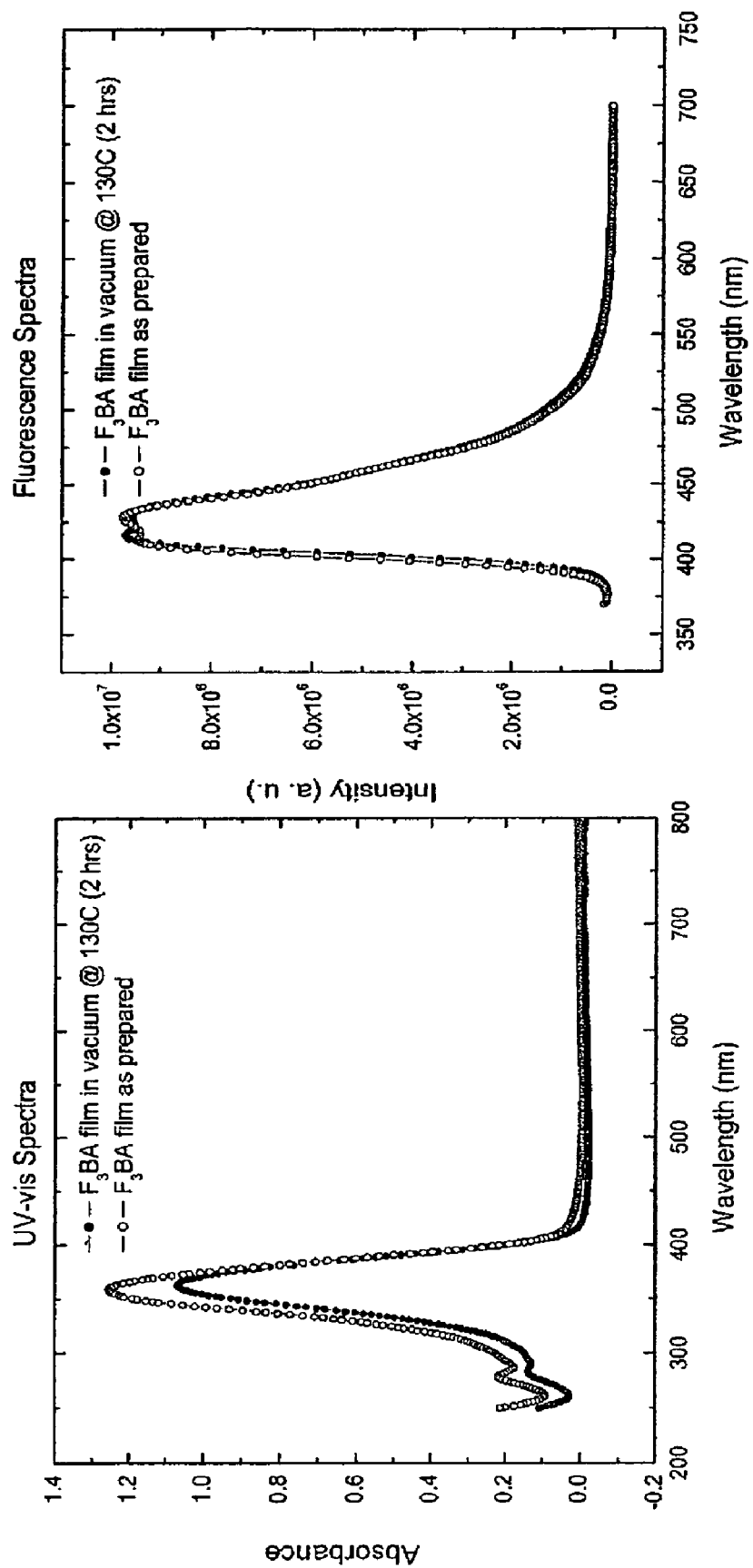
FIG. 3 is the UV-vis and fluorescence spectra for $F_3BA$ thin films.

Similar results were obtained for F3BA films upon heating (FIG. 3). Another important feature in the FL spectra is that the intensity did not decrease after a thermal treatment in vacuum. These results indicated that the cross-linking process used here did not cause substantial changes in the optical properties of this light-emitting material.

Figure 4:
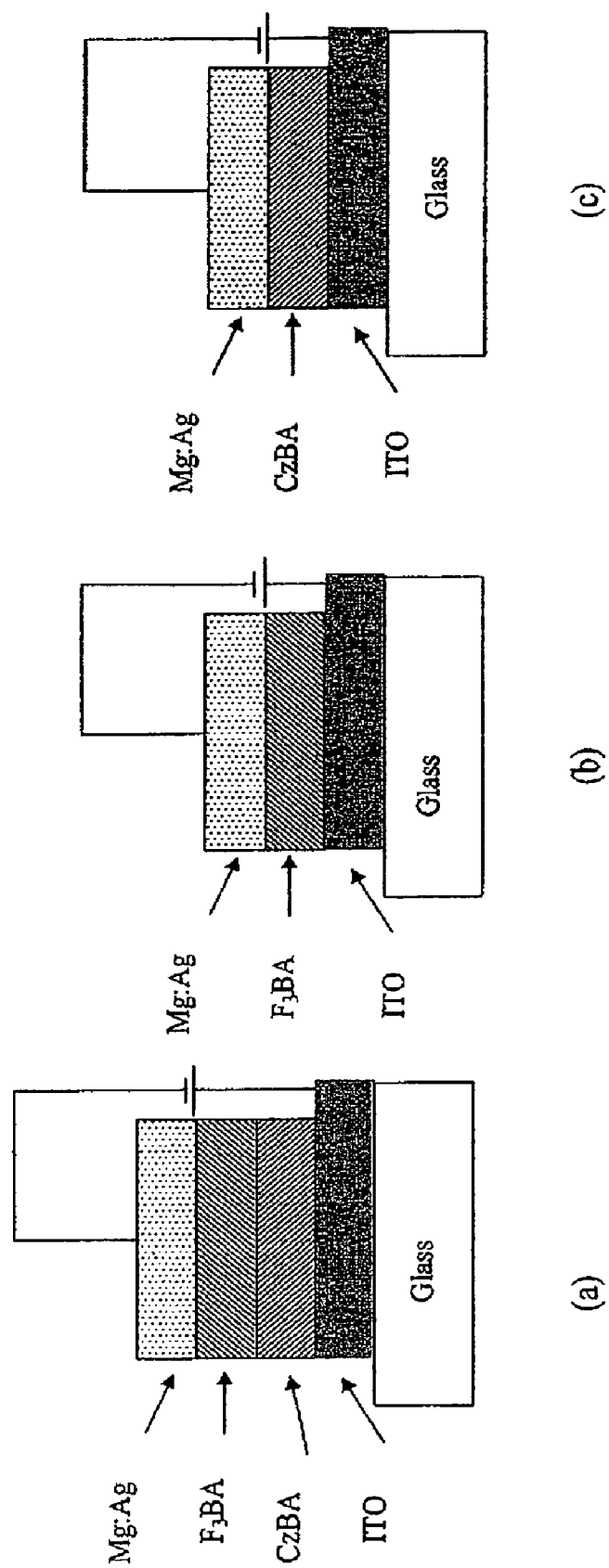
FIG. 4 is a schematic illustration of two single layer (b and c) and one double layer (a) structures according to the invention.

The advantage of the double layer structure:

For the comparison, three device structures were used as seen in FIG. 4.

Figure 5:
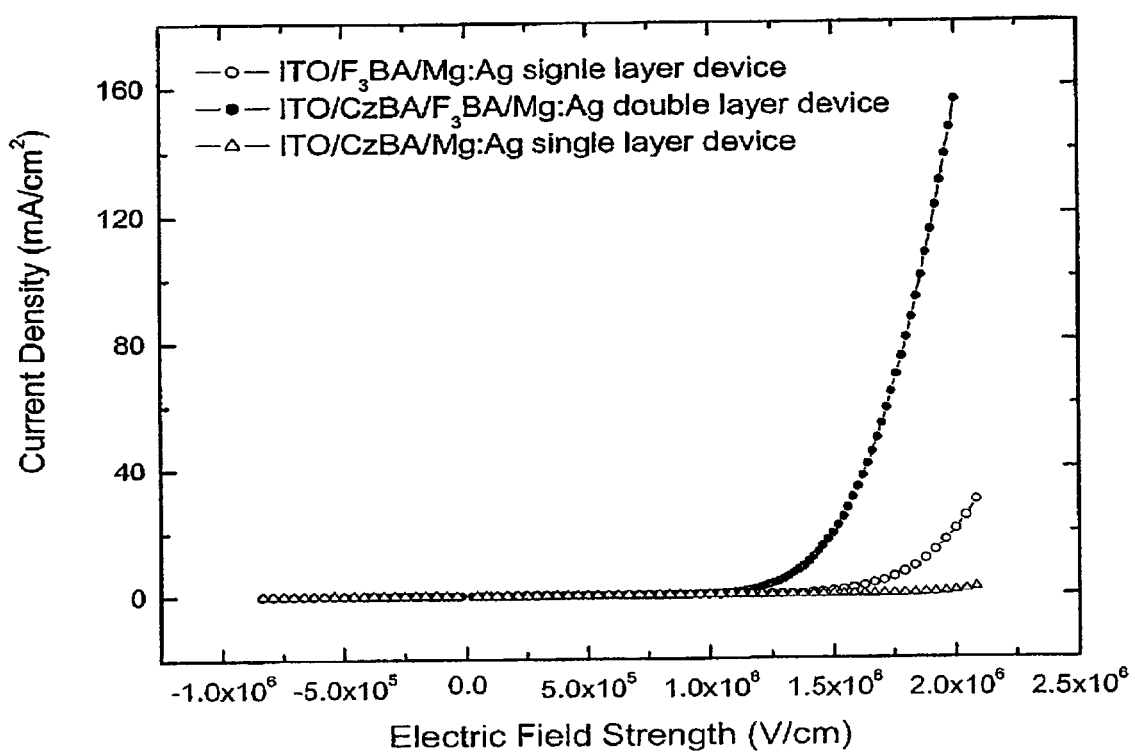
FIGS. 5 to 8 are graphs which compare the performance of single layer vs double layer devices according to the invention.

Devices with a double layer structure were successfully fabricated using CzBA and $F_3BA$ (FIG. 4(a)). The CzBA layer functioned as a hole-transporting layer, and $F_3BA$ functioned as an emissive and electron-transporting layer. The following are the device performance data of OLEDs based on a CzBA and $F_3BA$ double layer structure, and $F_3BA$ and CzBA single layer structures:

1. At the same electric field strength, the double layer structure device conducts much more electric current (current=hole current+electron current) than the single layer devices (FIG. 5).

Figure 6:
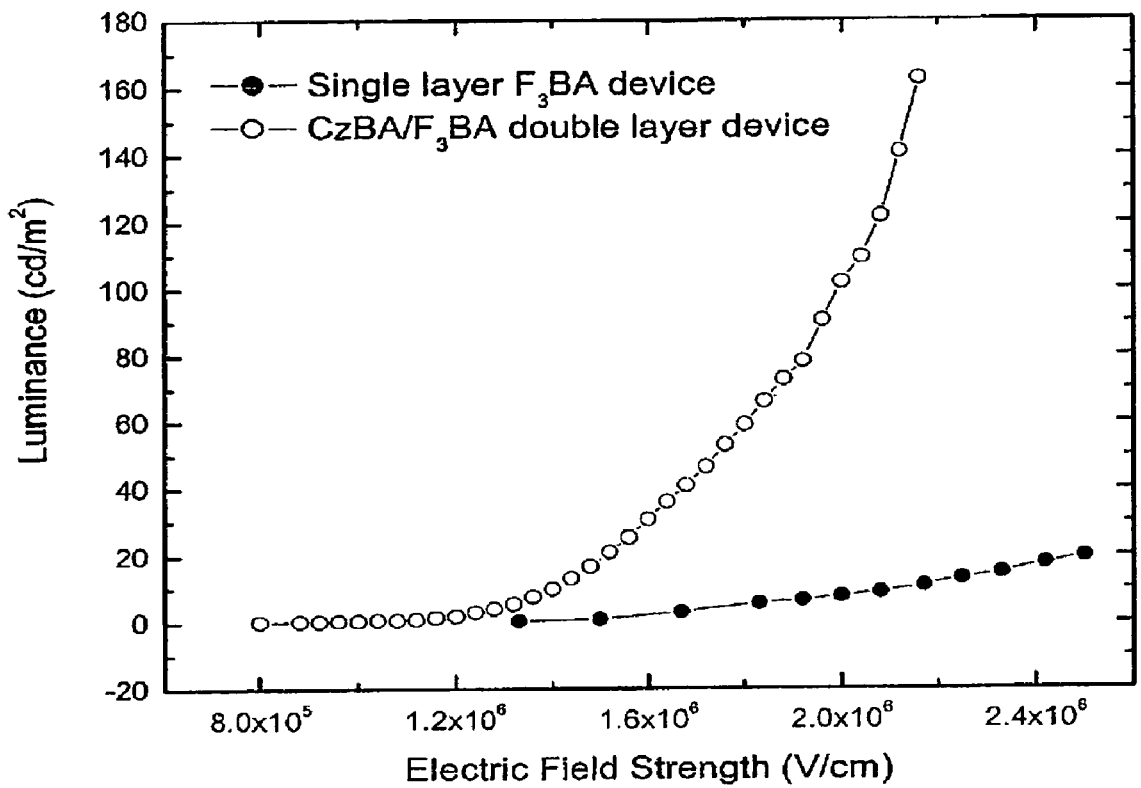

2. At the same electric field strength, the double layer structure device emits more intense light than the single layered device (FIG. 6).

Figure 7:
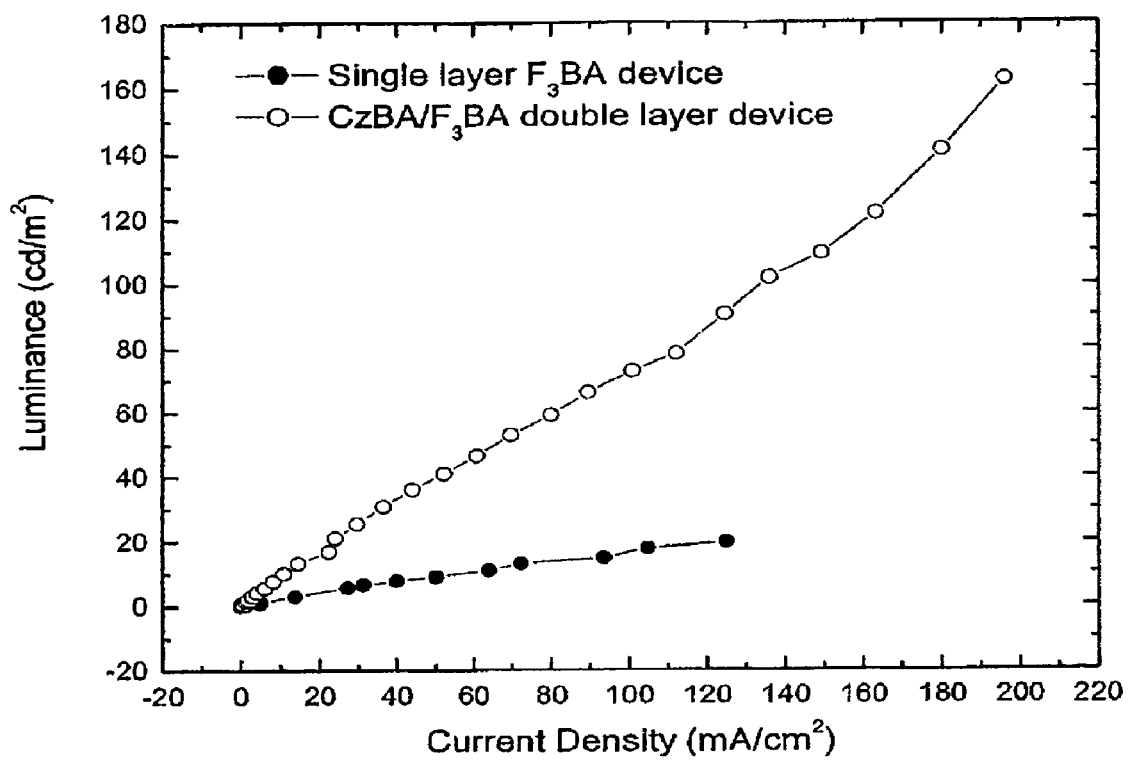

3. At the same electric current density, the double layer structure device emits more intense light, i.e. the device efficiency is much higher, than the single layer structure device (FIG. 7).

Figure 8:
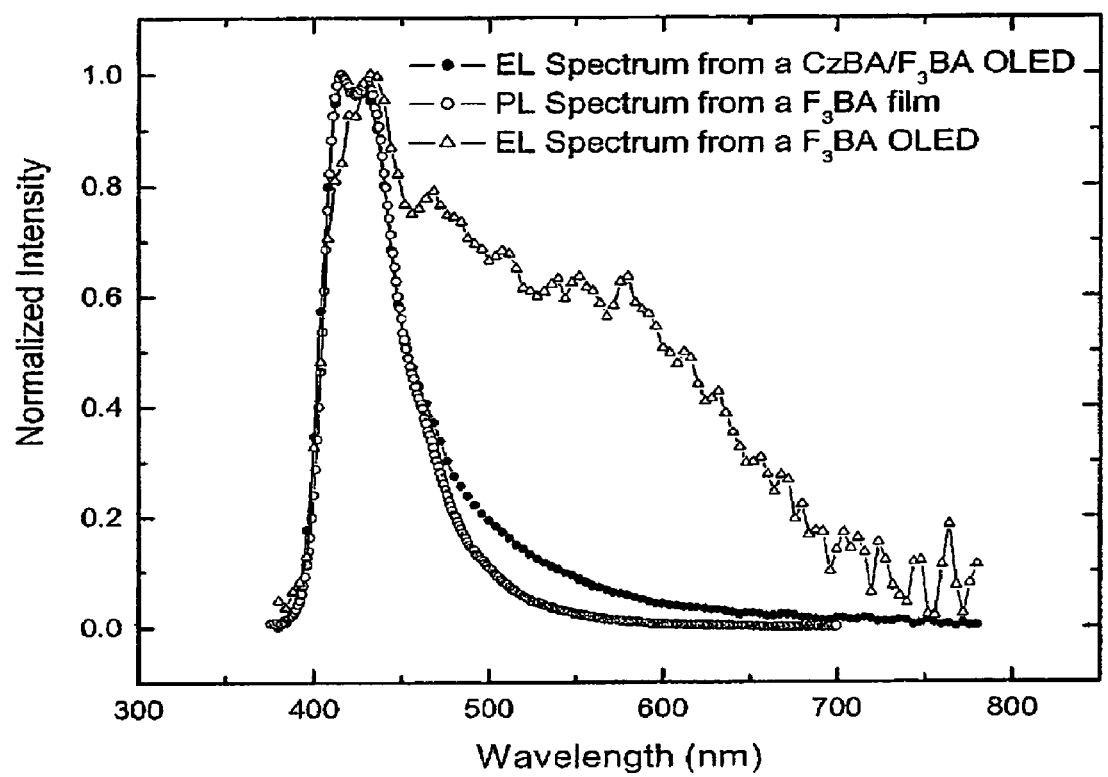

4. The electroluminescence (EL) spectrum of the CzBA/$F_3BA$ double layer device is identical to the photoluminescence spectrum of $F_3BA$ thin film (peaked at 416 nm). However, the EL spectrum of a single layer $F_3BA$ device is very different from the PL of $F_3BA$ thin film. There is a very broad long-wavelength shoulder appeared in the range of 500-700 nm (FIG. 8), that might be caused by imbalanced charge injection (i.e., electrons>>holes) in the device.

Figure 9:
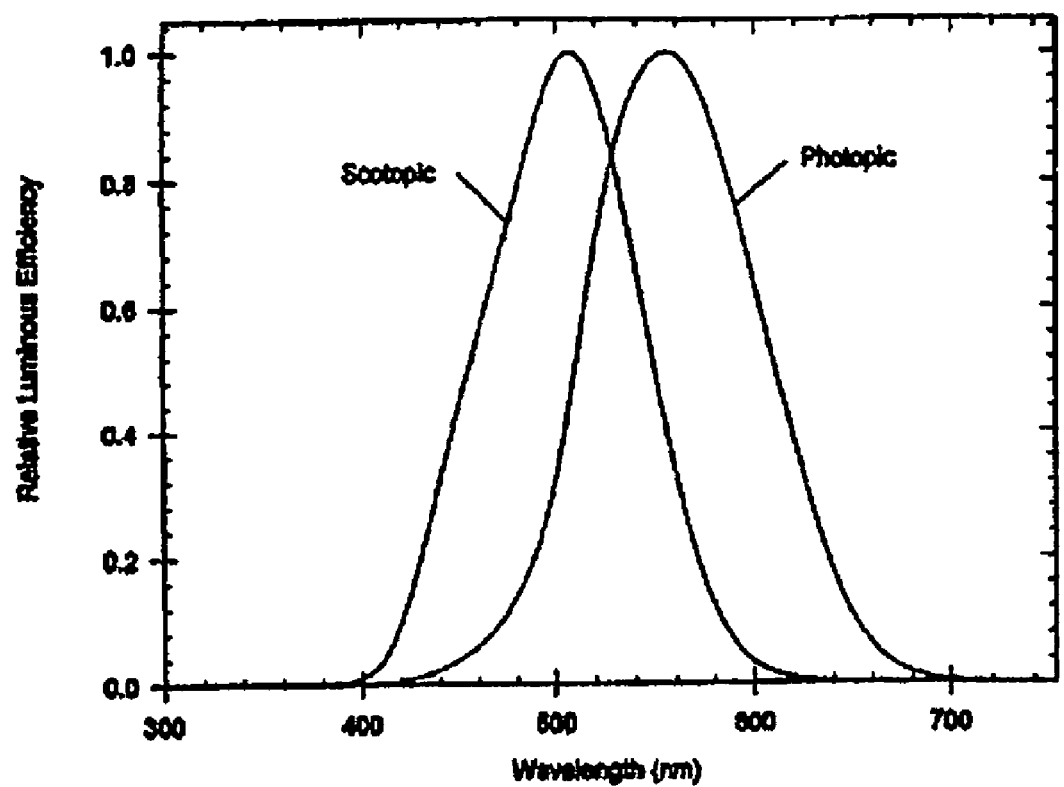
FIG. 9 is a graph illustrating the CIE spectral luminous efficiency functions for phototopic vision, V(λ), and scotopic vision V'(λ).

A double layer structure has been fabricated successfully by spin-coating CzBA and $F_3BA$ solution and the subsequent mild thermal treatment. This demonstrated that the thermal dehydration of diboronic acids to form cross-linked networks could be used as an easy and effective approach to fabricate double or multi-layered devices. Our preliminary experiments on thin film and device processing show that the thin films are quite uniform as indicated by the uniform thickness interference pattern, and uniform light emission area, which depends strongly on the layer thickness. The CzBA layer plays a role of hole-transporting layer, while the F3BA layer functions as both an electron-transporting layer and a light-emitting layer. The fact that the fluorescence intensity did not decrease after a thermal treatment at 130° C. indicates that the cross-linking process is useful in enhancing the thermal stability, especially for fluorene-based compounds, which are know spectrally unstable upon heat treatment. The maximum luminance value recorded for the CzBA/F3BA double layer device is around 170 cd/m². This value is obtained from a luminance meter which is calibrated as a photopic response device (FIG. 9).

Applying dehydration of boronic acids to fabricate multi-layered thin films has several advantages:

I. Processability by conventional spin-coating technology and very mild cross-linking conditions (room temperature –130° C. under vacuum) allow cost-effective fabrication of thin films.

II. The crosslinking reactions do not require any initiators are can be carried out under quite low temperatures (as low as room temperature) with water as the only by-product that can be easily removed under vacuum. Therefore there is no generation of highly reactive radicals involved and no harmful initiator residues left in the materials.

III. Multi-layered device structure can be easily realized using materials containing organoboronic acid groups. We have demonstrated that a CzBA layer and an F3BA layer can be stacked on each other forming a double layer structure; the total thickness of the double layer structure equals to the sum of the two individual layers. FIGS. 5-7 illustrates that we have incorporated desired hole-transporting, electron-transporting and emissive properties into a double layer devices using CzBA and F3BA, and each layer functioned as designed.

IV. Because each layer is cross-linked before applying the next layer, this technique can be applied to multi-layer structure or "super-lattice" type structure, not like the solubility based technique that only allows very limited layers.

V. High purity and mono-disperse chromophores give uniform optical and electronic properties and minimise the defects in the devices.

VI. No unstable or harmful terminal groups as in other oligomers or polymers, which could detract from the devices' stability.

VII. Thermally stable (organic/inorganic hybrid materials) as indicated in FIGS. 2 & 3 by comparing the photoluminescent spectrum and intensity before and after a thermal treatment in vacuum at 130° C. for two hours.

VIII. Because organic light emitting devices are very sensitive to the charge mobility, HOMO-LUMO level positions, and interface quality, the demonstration of a working OLED device indicates a reasonably good interface structure between the CzBA and F3BA layers. Since OLED is only used here as a testing vehicle, we expect the same film processing technique (using organoboronic acid groups as end caps) can be applied to the fabrication of photovoltaic cells, photonic multi-layer structures, and other electronic/optical devices.

IX. The properties of each layer are easily tunable by varying functional units in the boronic acid precursor or by simply mixing different precursors. There are very wide selections of functional units for the precursors with different optical and physical properties. On the other hand, the crosslinking of boronic acid groups could enhance compatibility of different components in the layer, and therefore could improve targeted properties.

X. Because of the end group crosslinking of the precursors, the amorphous morphology of the layers can be stabilized. The structure with such high crosslinking density will efficiently prevent any aggregation and crystallization, which is usually found in PLED and OLED devices, and cause the performance of the device to decline.

A double layer structure has been fabricated successfully by spin-coating CzBA and $F_3BA$ solution and the subsequent mild thermal treatment. This demonstrated that the thermal dehydration of diboronic acids to form cross-linked networks could be used as an easy and effective approach to fabricate double or multi-layered devices. Our preliminary experiments on thin film and device processing show that the thin films are quite uniform as indicated by the uniform thickness interference pattern, and uniform light emission area, which depends strongly on the layer thickness. The CzBA layer plays a role of hole-transporting layer, while the F3BA layer functions as both an electron-transporting layer and a light-emitting layer. The fact that the fluorescence intensity did not decrease after a thermal treatment at 130° C. indicates the cross-linking process is useful in enhancing the thermal stability, especially for fluorene-based compounds, which are know spectrally unstable upon heat treatment. The maximum luminance value recorded for the CzBA/F3BA double layer device is around 170 cd/m$^2$. This value is obtained from a luminance meter which is calibrated as a photopic response device (FIG. 9).

In addition to using boronic acids as outlined above, it is also possible, using classical chemical reactions, to react boronic acids or boronic acid derivatives such as boronates, with di- or polyalcohols (or thiols and the like) to form cross-linkable intermediates e.g. thin films, which may be crosslinked e.g. by heating, to form networks for use in a wide range of optical devices such as of light-emitting diodes (LEDs). Boronic acids react with simple alcohols, diols, and polyols under mild reaction conditions to form covalent esters.[21-23] When a boronic acid reacts with a polyol, or a boronic acid possessing di- or multiple boronic acid groups with a diol or polyol, a cross-linked network material can be expected (see FIG. 10, and Schemes 1 and 2 below). Dithiols or polythiols and the like, can also be used instead of the alcohols.

Similarly, the transesterification of boronates with alcohols or thiols readily occurs on heating. If a non-volatile diol or polyol is used for the reaction the resulting small molecule alcohol produced can be readily removed from the system, to give an immobilized cross-linked structure due to the formation of the new ester linkages (See Scheme 3 below).

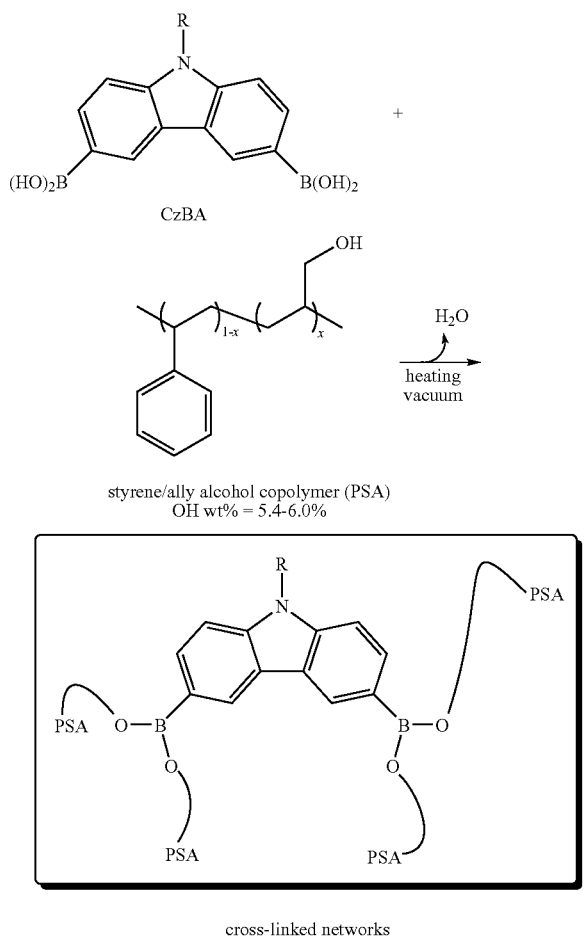

Scheme 1. Formation of hole-transporting networks via esterification of CzBA with PSA.

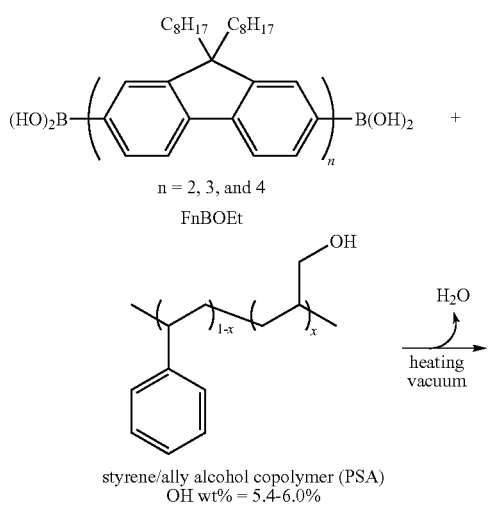

Scheme 2. Formation of blue-light emitting nerworks via esterification of FnBA with PSA.

-continued

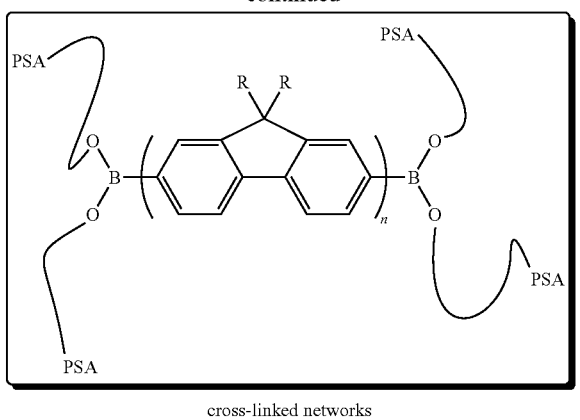

cross-linked networks

Scheme 3. Formation of blue-light emitting networks via transesterification of FnBOEt with PSA.

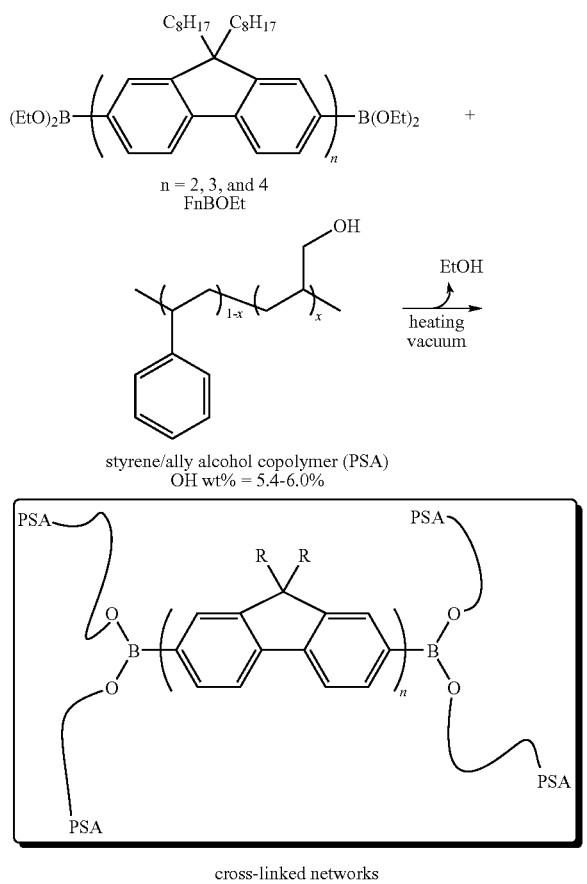

cross-linked networks

The novel crosslinked networks containing light emitting moieties have the potential of resolving problems associated with chain aggregation and/or excimer formation that can occur in LED's.

The crosslinkable components containing CzBA/PSA, FnBA/PSA, and FnBOEt/PSA have been used to form crosslinked hole-transporting and light-emitting thin films to demonstrate the feasibility of this approach (Scheme 1-3).

The organoboronic acids, CzBA, FNBA, and poly(styrene-co-allyl alcohol) (PSA) are readily soluble in THF. The TBF solutions of CzBA/PSA, FnBA/PSA, and FnBOEt/PSA can be used to fabricate thin films using traditional approaches such as spin-coating, solution-casting, or dip-coating techniques. Once the film has been prepared it can be crosslinked using mild reaction conditions (e.g., 120° C., 2 h) in which water is the by-product, that can be removed by vacuum (this reaction has been confirmed by FT-IR analysis). This thermal treatment procedure produces crosslinked thin films that are insoluble in water alone or in any anhydrous organic solvents. These films are also resistant to most wet common solvents such as THF and acetone. The crosslinked films produced as outlined above have higher optical stabilities (UV absorption and fluorescence) at elevated temperatures (e.g., 120° C., 24 h) than the crosslinked structures made solely from boronic acids (see Appendix I below).

Crosslinked films of CzBA and F3BA have been used as the hole-transporting layer and a blue light-emitting layer, respectively, in a LED device (see Appendix II below). Preliminary results demonstrated that (i) the fabrication of a double-layer LED device could be accomplished relatively easily and (ii) the color stability achieved using these thermally crosslinkable boronic acids are much improved.

It will be appreciated by those skilled in the art that this invention can also be extended to include other functionalities such as amines, silanols (or silicates), aluminum hydroxides (or aluminates), titanium alcoholates, and other metal hydroxide (or alcoholates), that can also be reacted with boronic acids or boronates to form crosslinked networks (See FIG. 10).

The invention provides the following advantages:

The use of mild crosslinking reaction conditions means that the generation of harmful structural defects is minimised.

Well-defined structures with identical chromophores, are obtained which give correspondingly sharper emission bands.

The resulting materials are amorphous on crosslinking and have high glass transition temperatures, Both systems effectively suppress chain aggregation and/or excimer formation and result in devices with high stable performance.

Versatility in tuning opto-electronic properties by simply mixing different functional molecules in one solution for the film coating.

Versatility in structural design to fine-tune the opto-electronic properties.

High solvent-resistance of the crosslinked structure allows the fabrication of multi-layered devices.

High purity and mono-disperse chromophores give uniform optical and electronic properties and prevent the defects in the devices. Our experiments (see below) on thin film and device processing show that the thin films are quite uniform as indicated by the uniform thickness interference pattern, and uniform light emission area, which depends strongly on the layer thickness.

No active, unstable terminal groups as in other crosslinkable polymers, which could detract from the devices' stability.

Thermally stable (organic/inorganic hybrid materials) as indicated in Appendix It by comparing the photoluminescent spectrum and intensity before and after a thermal treatment in vacuum at 130° C. for two hours.

Multi-layered device structure can be easily realized using materials containing organoboronic acid groups. In Appendix II, we have demonstrated that a CzBA layer and an $F_3BA$ layer can be stacked on each other forming double layer structure, the total thickness of the double layer structure equals to the sum of the two individual layers. In Appendix III, we demonstrated that we have incorporated desired hole-transporting, electron-transporting and emissive properties into double layer devices using CzBA and F$_4$BA, and each layer functioned as designed.

Because each layer is cross-linked before applying the next layer, this technique can be applied to multi-layer structure or "super-lattice" type structure, not like the solubility based technique that only allows very limited layers.

Because organic light emitting devices are very sensitive to the charge mobility, HOMO-LUMO level positions, and interface quality, the demonstration of—working OLED devices using boronic acids or boronates indicates a reasonably good interface structure between the—hole-transporting layer and the emitting layer. Since OLEDs are only used here as a testing vehicle, we expect the same film processing technique (using organoboronic acid groups as end caps) can be applied to the fabrication of photovoltaic cells, wave guide structures, 1-D photonic crystals using multi-layer structures, and any other electronic or optoelectronic devices using multiplayer structures.

The properties of each layer are easily tunable by varying functional unit in the monomer or by incorporating different monomers by simply mixing. There are very wide selections of functional units for the monomers with different optical and physical properties. On the other hand, the crosslinking of boronic acid groups enhanced compatibility of different mixed monomers in the layer, and therefore promoted some properties.

Because of crosslinking of the monomers, the amorphous morphology of the layers has been stabilized. The structure with such high crosslinking density will efficiently prevent any aggregation and crystallization, which is usually found in PLED and OLED devices, and cause the performance of the device to decrease. Thus polymer thin films made from this class of materials are not only applicable to multiplayer structures, but can also be used in single layer devices to improve stability, and reduce the possibility of aggregation.

These materials can also be used as a matrix to incorporate other functional materials (either small molecules or polymers) such as charge transporters, dyes, etc.

Appendix I;

Crosslinkable functional materials based upon organoboronic acids or organoboronates for multi-layer devices Results and Discussion 1. Self-Condensation of Oligofluorene Diboronic Acids to Form Amorphous Polymer Networks Useful as Blue Light Emitters.

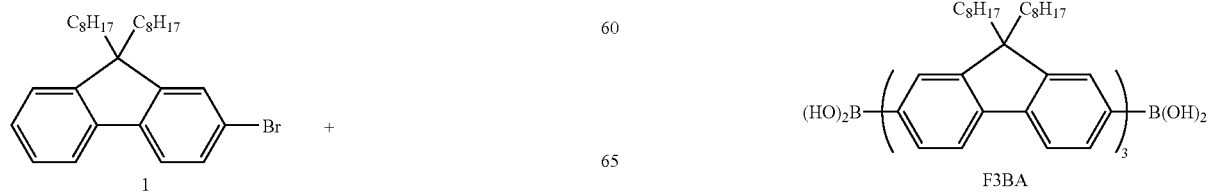

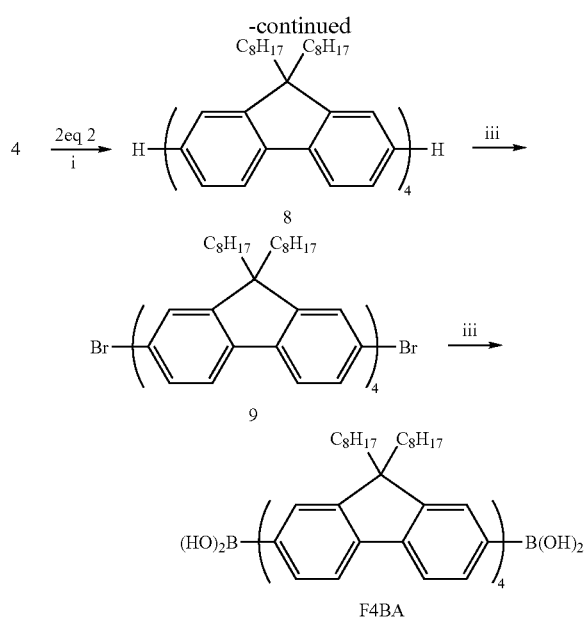

F4BA i). 2% mol Pd(PPh$_3$)$_4$, 2M Na$_2$CO$_3$, toluene, reflux.
ii). Br$_2$, CH$_2$Cl$_2$, 0-r.t.
iii). (a) 2.0eq n-BuLi, THF, -78° C.; (b) 4.2 eq B(OiPr)$_3$, -78° C.; (c) 2N HCl.

Figure 11:
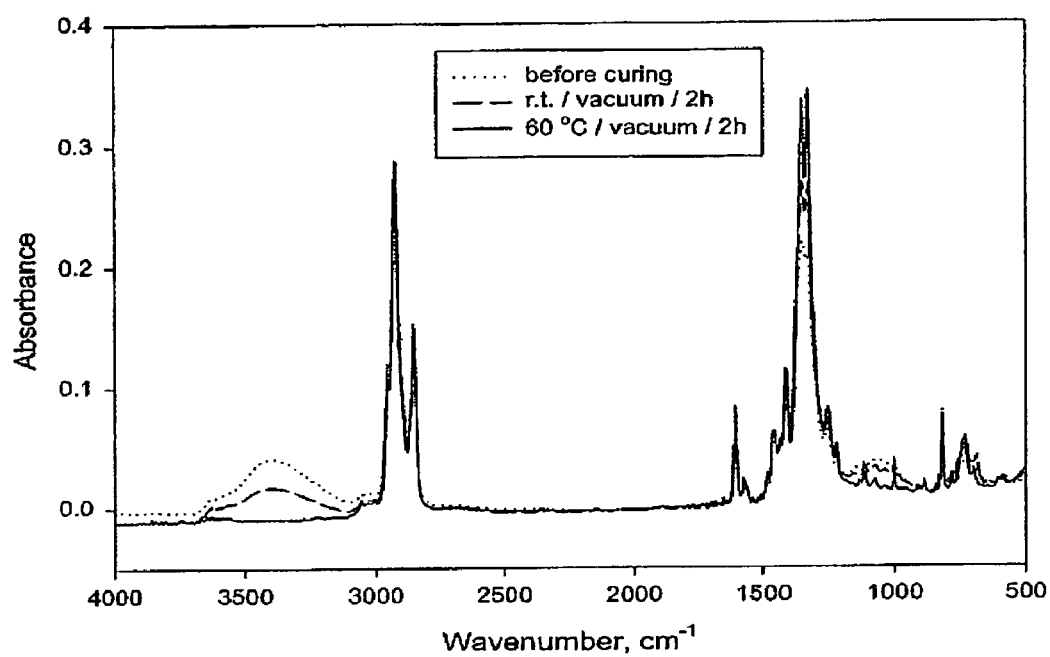
FIG. 11 is the IR spectra of the diboronic acid F2BA.

Materials synthesis. Oligofluorenes carrying boronic acid groups at 2- and 7-postions, F2BA, F3BA, and F4BA, were synthesized according to procedures outlined in Scheme 1. The starting materials, 2-bromo-9,9-dioctylfluorene (1), 2-dihydroxyboranyl-9,9-dioctylfluorene (2), and 2,7-dibromo-9, 9-dioctylfluorene (5), were prepared according to the reported methods. The Suzuki coupling reaction of 1 and 2 was carried out in a refluxing toluene/aqueous 2M Na$_2$CO$_3$ solution containing 2% mol of Pd(PPh$_3$)$_4$ for 48 h to give the fluorene dimer 3. Bromination of 3 using Br$_2$ in dichloromethane afforded the dibromo dimer 4. F2BA was then prepared via lithiation of 4 using 2.5M n-BuLi at −78° C. in TBF, followed by subsequent in-situ reaction with triisopropylboranate, and hydrolysis with 2N HCl. Similar procedures were used to prepare the diboronic acids F3BA and F4BA from compounds 5 and 4, respectively, as illustrated in Scheme 1. After being dried under vacuum at room temperature, the compounds F2BA, F3BA, and F4BA were reluctant to dissolve in dry solvents, presumably due to the formation of some crosslinked structures through partial dehydration of boronic acid groups (confirmed by the IR spectroscopy). However, when small traces of water were added, they readily dissolved in solvents such as THE, acetone, and DNT. In the presence of water it would appear that the crosslinked linkages in these materials are probably hydrolyzed to release soluble free boronic acids. The resultant solubility of these compounds under these conditions facilitates the characterization of their chemical structures in addition to their fabrication into films by solution casting. The ER spectra of these diboronic acids (the spectrum of F2BA is shown in FIG. 11 as an example) clearly revealed the existence of B(OH)$_2$ groups, which was evidenced by a broad band at 3430 cm$^{-1}$ due to the BO—H stretching and a strong absorption around 1330-1340 cm$^{-1}$ attributable to the asymmetric B—O stretching. $^1$H NM spectra of F2BA and F3BA have also been obtained in acetone-d$_6$ in the presence of trace of D$_2$O, which confirm the existence of this structure. Although F4BA could be dissolved in wet acetone, the resultant transparent solution was found to be metastable and became cloudy within minutes, and eventually a white solid precipitated. When an equivalent amount of toluene was added to the mixture, however, the solid dissolved again. The $^1$H NMR measurement of F4BA was therefore carried out in a solvent mixture containing toluene-d$_7$/acetone-d$_6$/D$_2$O (v/v: 20/5/1). The above observed solubility changes noted for F4BA suggest that the intermolecular interactions within F4BA in the solid state are dominated by the hydrogen bonding between boronic acid groups. Once the hydrogen bonding has been destroyed by the polar solvents, the hydrophobic moieties in F4BA self-assemble to aggregates, which is driven by the intermolecular van der Waals force. As will be discussed below, this strong hydrogen bonding presumably has the effect of overcoming the weaker intermolecular π-π interaction, thereby completely suppressing chain aggregation and/or excimer formation in the solid state.

Cross-linking reaction. Polymer films on KBr disks were prepared by casting solutions of F2BA, F3BA, and F4BA in THEF followed by the evaporation of the solvent in the air. These films were subjected to IR measurements. The cast films were then cross-linked in a vacuum oven at different temperatures. As shown in FIG. 11, the IR absorption of the BO—H groups of F2BA at 1331 cm$^{-1}$ virtually disappear after heating at 60° C. for 2 h. At the same time a new absorption peak at 732 cm$^{-1}$, assigned to the out-of-plane vibration of the boroxine structure appears. Similar IR results were observed for F3BA and F4BA (spectra not shown). These changes in the IR spectra strongly suggest the formation of cross-linked networks via the formation of six-membered boroxine rings (Scheme 2). It was also noted that this dehydration could also occur at room temperature (FIG. 11). The ease of this dehydration reaction in the solid state under such mild reactions conditions might be accounted for the close proximity of boronic acid groups to each other due to hydrogen bonding (Scheme 2). As mentioned above, these cross-linked structures can be readily hydrolysed in the presence of wet polar solvents such as THF and acetone, but they are insoluble in water alone and in anhydrous organic solvents. This property offers excellent processing capabilities for the materials, facilitating the fabrication of multi-layered films by the use of anhydrous solvents. This property should also pose no problem for these materials in applications requiring a dry atmosphere such as LEDs.

Scheme 2

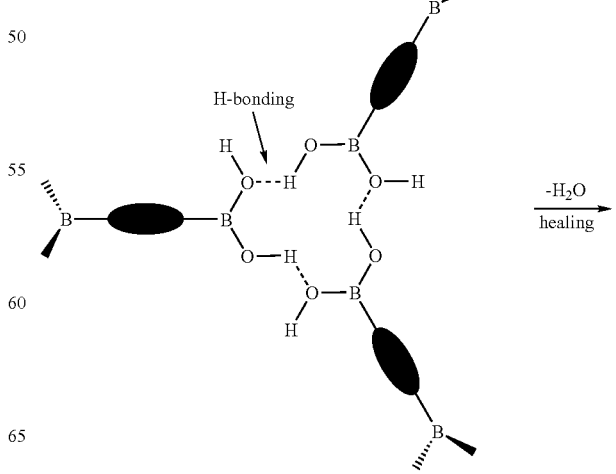

-continued

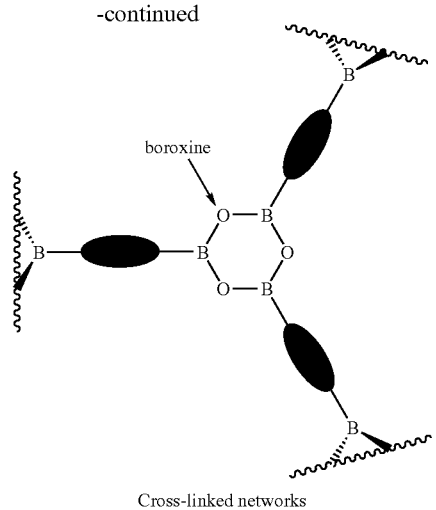

Cross-linked networks

Figure 12:
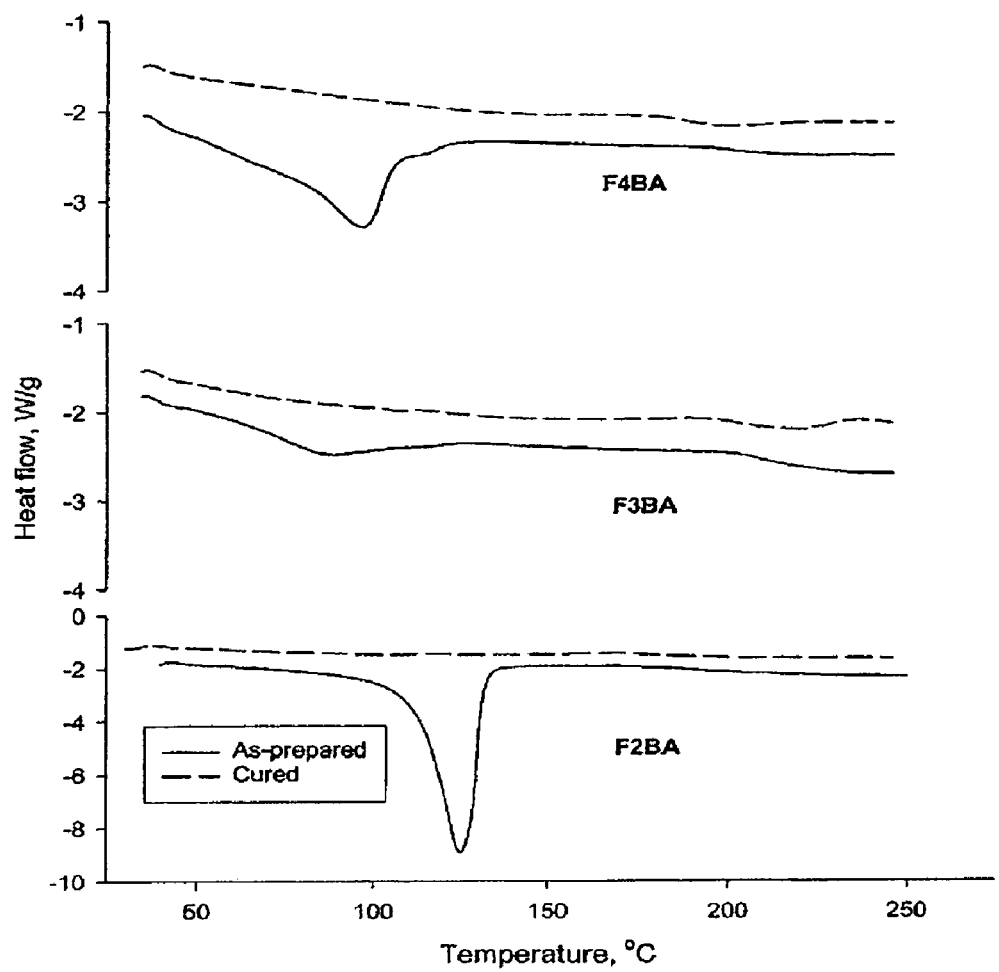
FIG. 12 illustrates DSC curves (first heating run) of the oligofluorene diboronic acids at a heating rate of 10° C./min under nitrogen (50 mL/min).

Thermal properties. DSC and TGA analyses were performed on the F2BA, F3BA, and F4BA sample as prepared. The DSC curve of the F2BA on the first heating scan (r.t.-250° C.) shows a large endothermic peak at 125° C. (FIG. 12), associated with the melting and partially dehydration of the boronic acid groups (confirmed by TGA analysis). Similarly the F3BA and F4BA samples exhibited broad melting points that peaked at 86 and 63° C., respectively. However it was interesting to note that their heat capacities were much lower than that of F2BA, suggesting that these materials have low degrees of crystallinity. On the other hand, after being cured at 110° C. under vacuum for 2 h, the F2BA, F3BA, and F4BA samples showed no melting points during the DSC scans on the first heating. Only slight transitions with onset temperatures of 173° C. for F2BA, 202° C. for F3BA, and 181° C. for F4BA, were observed, which were attributed to glass transition temperatures ($T_g$'s). The high Tg's of these materials suggest that the thermal treatment under mild conditions (110° C., 2 h, under vacuum) could be responsible for the production of thermally stable amorphous polymer networks. Second DSC heating scans, on both the cured and non-cured samples, however, no longer exhibited any transitions below 250° C. indicating that the dehydration was completed during the first heating scan and the resulting networks have an even higher crosslinking densities.

Figure 13:
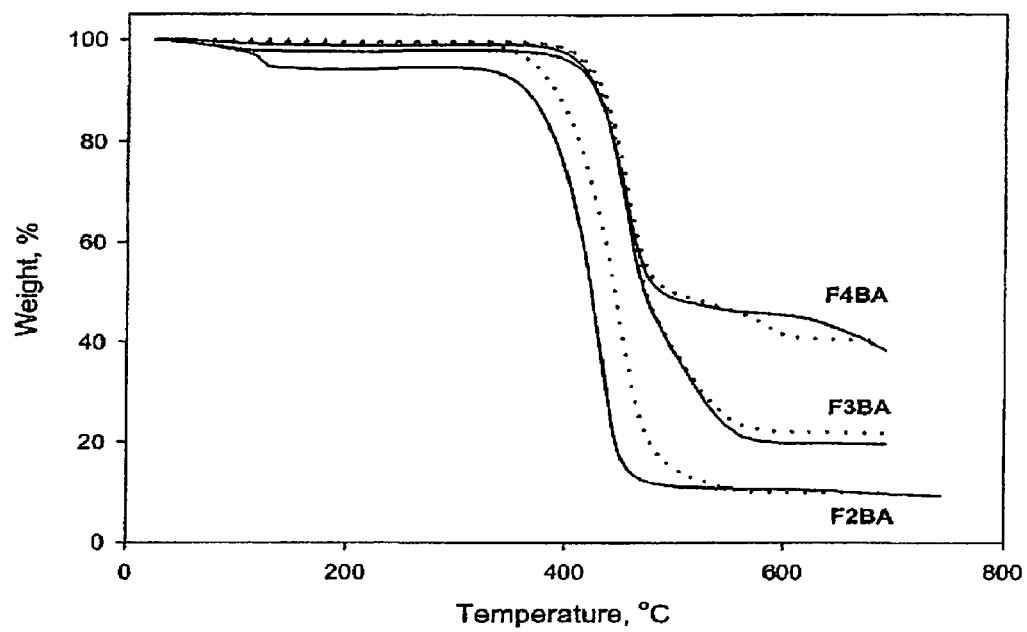
FIG. 13 illustrates weight loss curves for the as-prepared and cured F2BA, F3BA, and F4BA samples obtained at a heating rate of 5° C./min under nitrogen (50 mL/min).

The TGA analysis of F2BA shows that this compound starts to lose weight as soon as heating commences with a rapid loss of weight occurring at 114° C., due to the dehydration of boronic acid groups (FIG. 13). The dehydration is almost complete once 150° C. has been reached with the weight remaining relatively constant up until 393° C. when the sample starts to decompose. Similar trends were observed for the other two samples F3BA and F4BA with a first transition (dehydration) at 72 and 82° C., and a second transition (decomposition) at 427 and 426° C., respectively. The weight losses due to the dehydration for F2BA, F3BA, and F4BA were 5.6%, 1.1%, and 2.3%, respectively. These values show some discrepancies with the calculated values (4.2%, 2.7%, and 2.2%, respectively), probably due to slight variations in the drying conditions used in their synthesis.

All three cured samples showed no weight losses prior to decomposition, indicating that complete dehydration of the samples had occurred under these chosen curing conditions (110° C., 2 h, under vacuum). The onset decomposition temperatures for the cured samples F2BA, F3BA, and F4BA were 405, 428, and 429° C., respectively, very close to the results of the uncured samples (393, 427, and 426° C.). The 5% weight loss temperatures for the cured F2BA, F3BA, and F4BA were 370, 417 and 420° C., respectively. These results clearly demonstrate the high thermal stability of these crosslinked materials.

Figure 14:
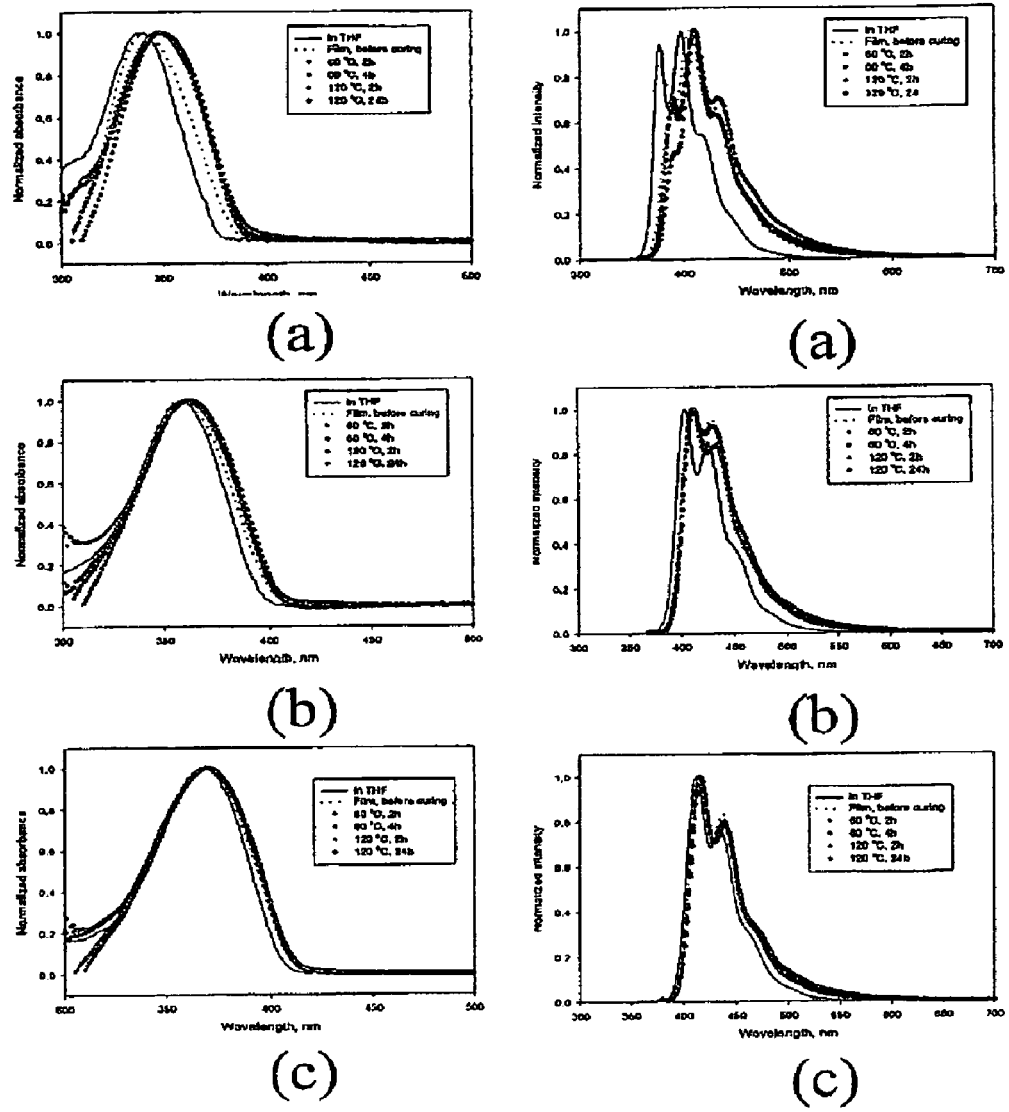
FIG. 14 illustrates UV-vis (left) and photoluminescence spectra (right) of (a) F2BA, (b) F3BA, and (c) F4BA in solution and in the solid state.

Photophysical properties. The UV-vis spectrum of F2BA in TEF has a red-shifted absorption maximum at 341 nm, compared with its precursor, dimers 3 ($\lambda_{max}$ 329 nm) and 4 ($\lambda_{max}$ 336 nm) (FIG. 14 and Table 1). This red shift can be accounted for by the involvement of the boronic acid groups in the main chain conjugation. This arises because the B—O bond has been reported have some double bond character due to back coordination of the oxygen to boron. The samples F3BA and F4BA showed similar red-shifts in their λ max's (359 nm and 369 nm) compared with their corresponding oligomers 6 (352 nm), 7 (355 nm), 8 (363 m), and 9 (366). However, in these cases the contribution from the boronic acid groups appears to be less evident because of the increased length of the backbone. The photoluminescence spectrum of F2BA in THEF exhibited two vibronic peaks at 376 and 397 nin, associated with a shoulder at 420 nm (FIG. 14). Meanwhile F3BA has two emission peaks at 402 and 424 nm and a shoulder at 451 nm, while the F4BA displayed two peaks at 413 and 436 nm and a shoulder at 465 nm. These peaks associated with F4BA are very close to those reported for polyfluorenes (415 and 439 nin). These oligofluorene diboronic acids are highly luminescent in solution with fluorescence yields ($\phi_f$s) of 85% (F2BA), 96% (F3BA), and 98% (F4BA), respectively. These values are higher than those reported for most of polyfluorenes. The confinement of excitons in these conjugated oligofluorenes might explain their high fluorescence yields.

TABLE 1

Photophysical Properties of Oligofluorene diboronic acids.

| | Solution | | | As-prepared | | After curing[a] | |
|---|---|---|---|---|---|---|---|
| | $\lambda_{max, abs}$ nm | $\lambda_{max, em}$ nm | $\phi_f$, % | $\lambda_{max, abs}$ nm | $\lambda_{max, em}$ nm | $\lambda_{max, abs}$ nm | $\lambda_{max, em}$ nm |
| F2BA | 341 | 376, 397, 420(s) | 85 | 341 | 387(sh) 406 429(sh) | 349 | 392(s), 409, 433(s) |
| F3BA | 359 | 402, 424, 451(s) | 96 | 359 | 409, 429 | 363 | 411, 430 |
| F4BA | 369 | 413, 436, 465(s) | 98 | 368 | 415, 438, 469(s) | 369 | 416, 438, 473(s) |

[a]Conditions: 60° C. under vacuum for 2 h.

Films of F2BA, F3BA, and F4BA were prepared by dissolving in TF (10 mg/mL THP), which contained a trace of water, drying over MgSO$_4$, and filtering. Spin-coating these solutions onto glass substrates gave uniform, transparent thin films, despite the fact that these compounds showed some extent of crystallinity in their powdery state. The as-spun films of F2BA, F3BA, and F4BA displayed absorption peaks at 341, 359, and 368 nm, respectively, nearly identical to those measured in solution (FIG. 14 and Table 1). Under UV irradiation, F2BA films emitted violet-blue light, whereas films of F3BA and F4BA emitted bright blue light. Emission $\lambda_{max}$'s of these compounds bathochromically shifted 9 nm (from 397 to 406 nm) for F2BA, 7 nm (from 402 to 409 nm) for F3BA, and only 2 nm (from 413 to 415 nm) for F4BA (FIG. 14 and Table 1). The absence of any long wavelength emission peaks in the 500-600 nm region suggests that no aggregation was occurring in these thin films. The complete suppression of chain aggregation is likely attributable to the strong hydrogen bonding associated with the boronic acid groups that prevents the congregation of the oligomer backbones. After being cured at 60° C. under vacuum for 2 h, the absorption $\lambda_{max}$'s of these films red-shifted 8 nm for F2BA, 4 nm for F3BA, and 1 nm for F4BA. Slight red-shifts in the emission $\lambda_{max}$'s were also observed for these films (3 nm for F2BA, 2 nm for F3BA, and 1 nm for F4BA). However, in all cases there were still no signs of long wavelength emissions and the red-shifts in the absorption and emission $\lambda_{max}$'s were assumed to be the result of the slight increase in conjugation due to the boxirine ring with the main chain π-system. Prolonged curing (60° C., 4 h) or heating at a higher temperature (120° C., 2 h) did not appear to cause any appreciable changes in the UV-vis and fluorescence spectra of these compounds indicating the absence of any chain aggregation and/or excimer formation. Even heating at 120° C. for 24 h caused no noticeable changes in the UV-vis spectrum of the F2BA film. Although the emission spectrum of the F2BA film showed a relatively lower emission peak at 392 nm and a more pronounced emission at 433 nm, the peaks were located at almost the same positions. These changes in the line shape of emission may be due to fitter formation of boroxines at elevated temperatures resulting in a slightly more extended conjugation system. The F3BA film after heating at 120° C. for 24 h also showed a very stable UV-vis spectrum. The emission peaks of the F3BA were also almost maintained at the same positions, even though the peak at 430 nm became slightly lower, probably due to the above-mentioned reason. On the other hand, there was almost no change in the UV-vis and fluorescence spectra of F4BA films after being heating at 120° C. for 24 h. These results suggest that the amorphous architecture of the as-spun films were fully maintained in the cured films due to the transformation of the hydrogen bonding to the more stable boroxine linkages with the liberation of water molecules (Scheme 2). The fact that no long wavelength emission occurred in the 500-600 nm region were observed with any of these oligofluorene networks, clearly suggests that chain aggregation and/or excimer formation were fully suppressed.

Part 2. Self-Condensation of Boronic Acids to Form Amorphous Polymer Networks Useful as Hole-Transporting Materials Scheme 3. Synthesis of hole-transporting boronic acids

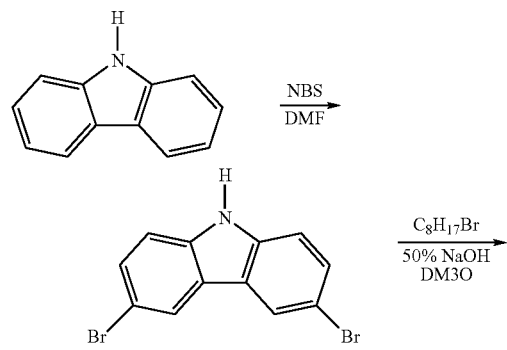

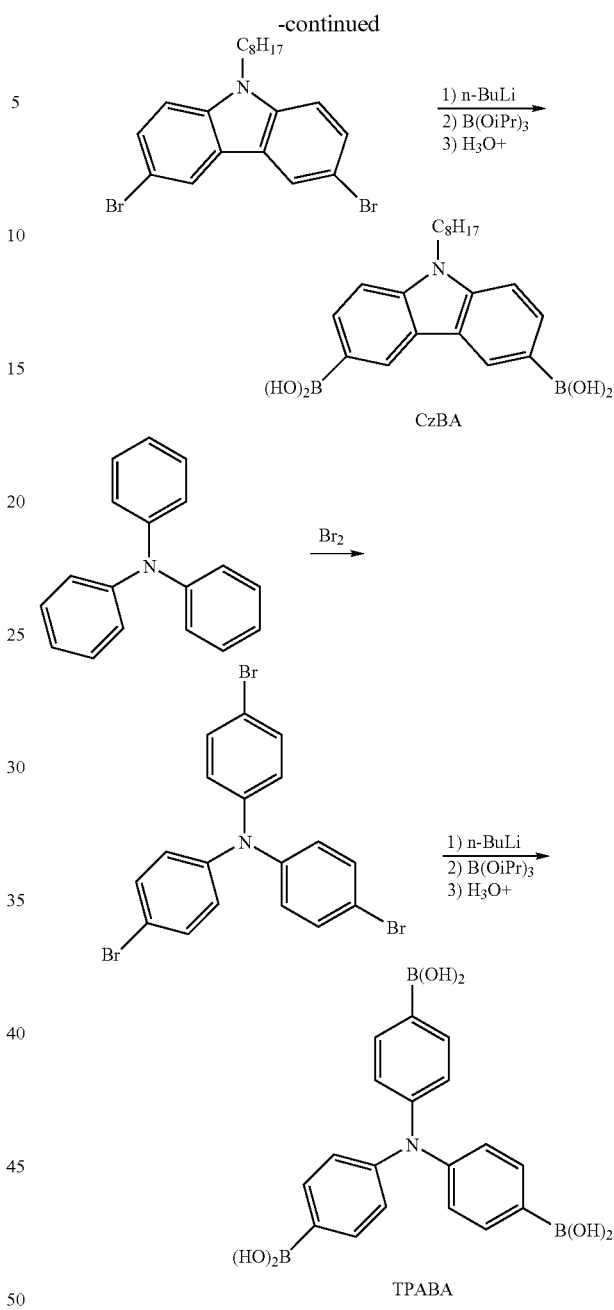

Figure 15:
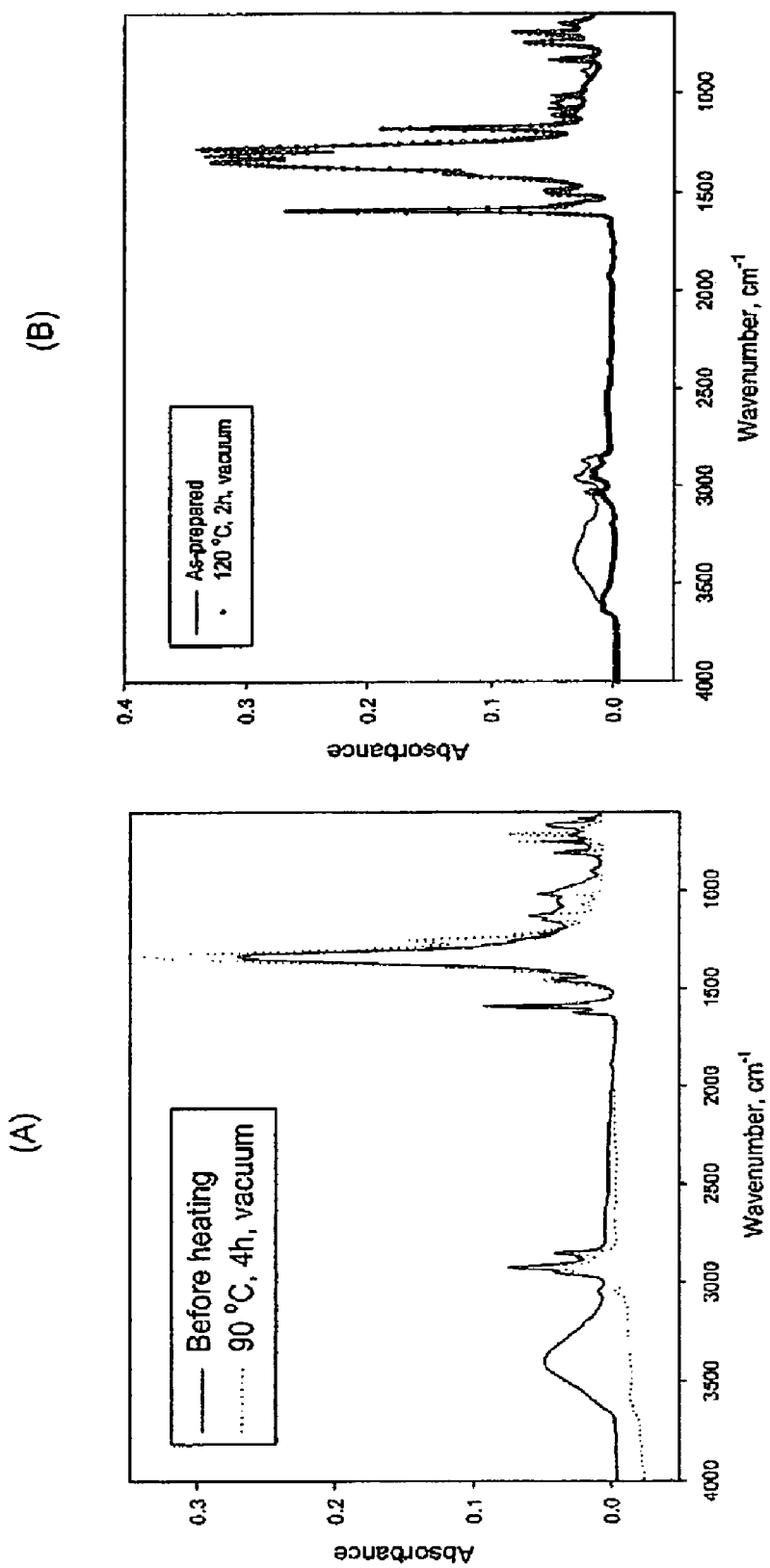
FIG. 15 is the FT-IR spectra of as-prepared and cured films of (A) CzBA and (B) TPABA.

Carbazole and triarylamine derivatives are known good hole-transporting materials useful in LEDs. 9-Octylcarbazole-3,6-diboronic acid (CzBA) and tris(4-dihydroxyboranylphenyl)amine (TPABA) were synthesized (Scheme 3). FIG. 15 clearly indicates the complete self-condensation of these materials after heating under vacuum at 90° C./4 h for CzBA and 120° C./2 h for TPABA.

Part 3. Esterification of Boronic Acids with Polyols to Form Amorphous Polymer Networks Useful as Blue Light Emitting Materials.

Cross-Linking Reactions (Scheme 4).

F2BA, F3BA, and F4BA were dissolved in THIF containing trace of water. Then PSA was dissolved in above solutions. The solutions were dried over $MgSO_4$ and were used to make films on KBr disks.

Scheme 4

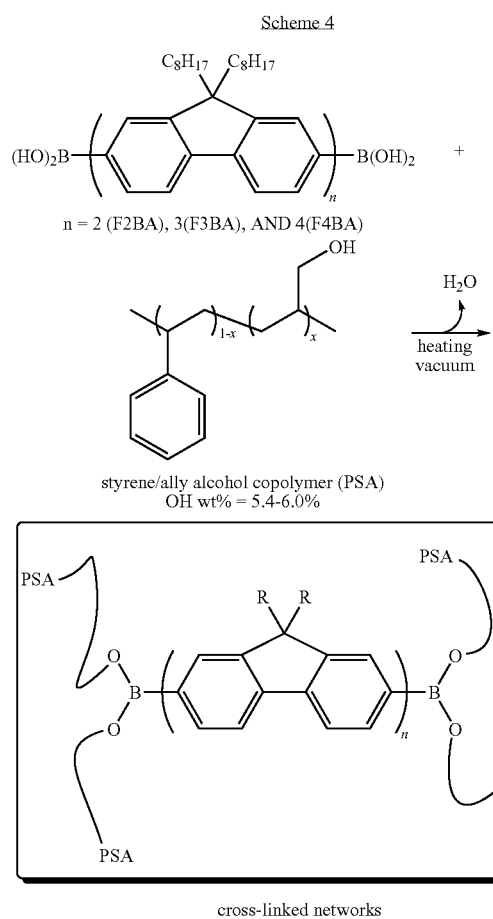

Figure 16:
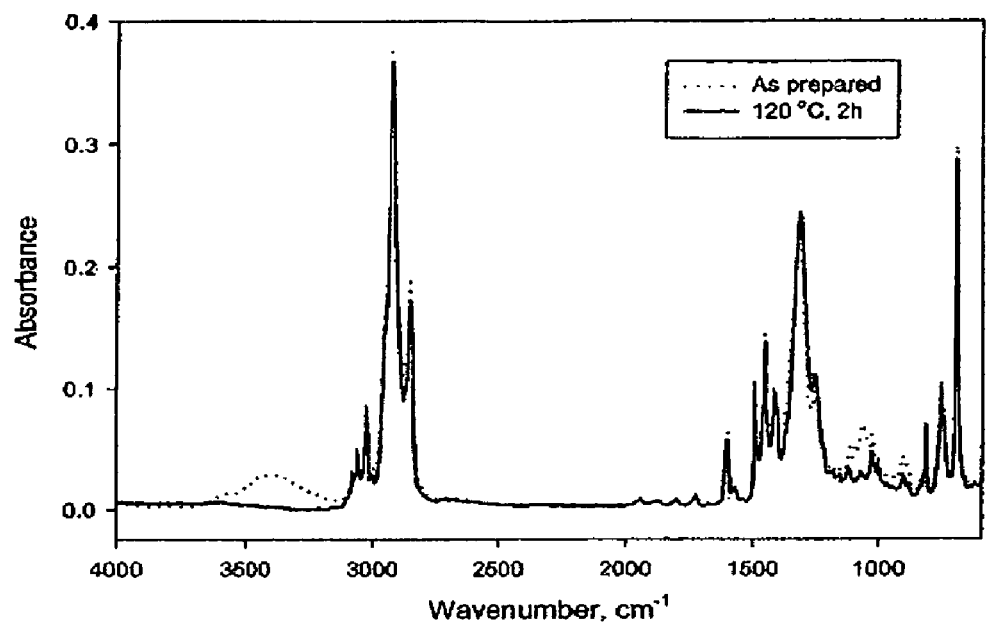
FIG. 16 is the FT-IR spectra of F2BA/PSA samples.
Figure 17:
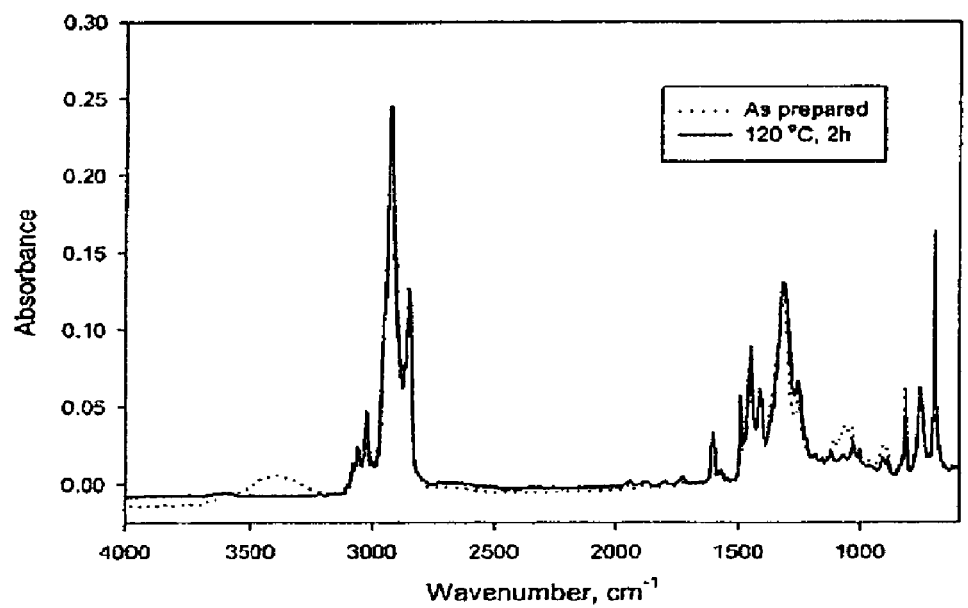
FIG. 17 is the FT-IR spectra of F3BA/PSA samples.
Figure 18:
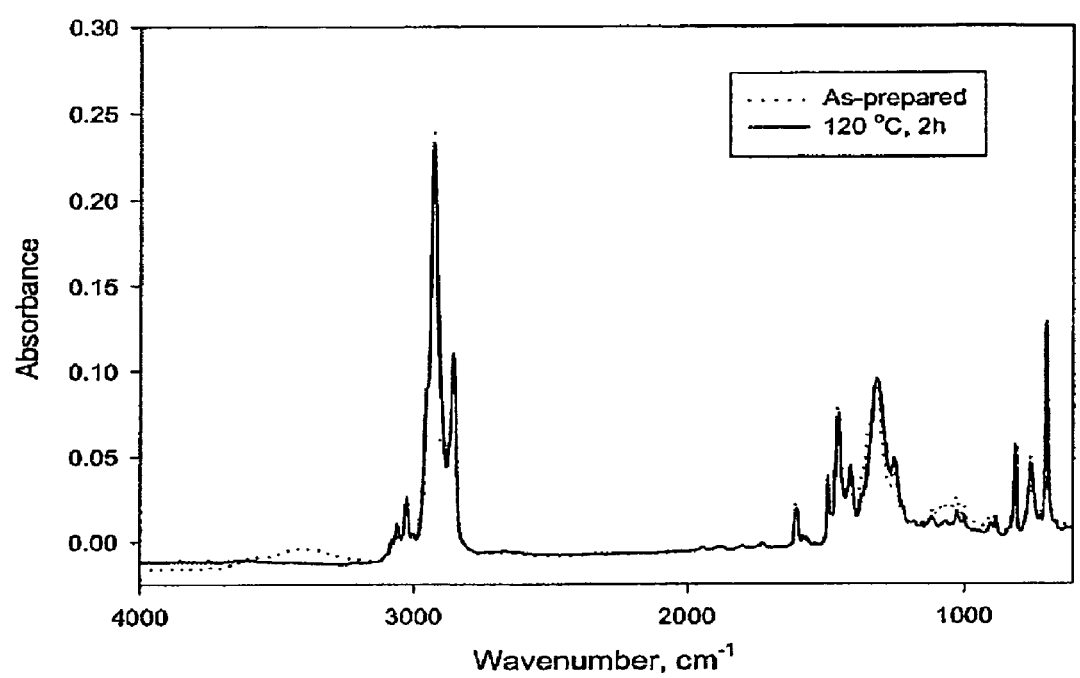
FIG. 18 is the FT-IR spectra of F4BA/PSA samples.

After heating at 120° C. for 2 h under vacuum, OH groups in boronic acids or polyols almost disappeared (FIGS. 16, 17, and 18), indicating the esterification is much more favored than the self-condensation of boronic acids.

2. UV-Vis and PL Properties.

UV-vis. Spectra. Thin films were fabricated on glass substrates from above solutions by spin-coating. The cross-linking was conducted in a vacuum oven at 120° C. for 2 h. As shown in Table 2, the absorption maxima ($\lambda_{max}$'s) of the cured films exhibited slight blue shifts (2 nm), compared with as-prepared films, instead of red-shifts as observed for the cured films made by self-condensation of boronic acids (F2BA, 341 to 349 nm; F3BA, 359 to 363 nm; F4BA, 368 to 369 nm).

Figure 19:
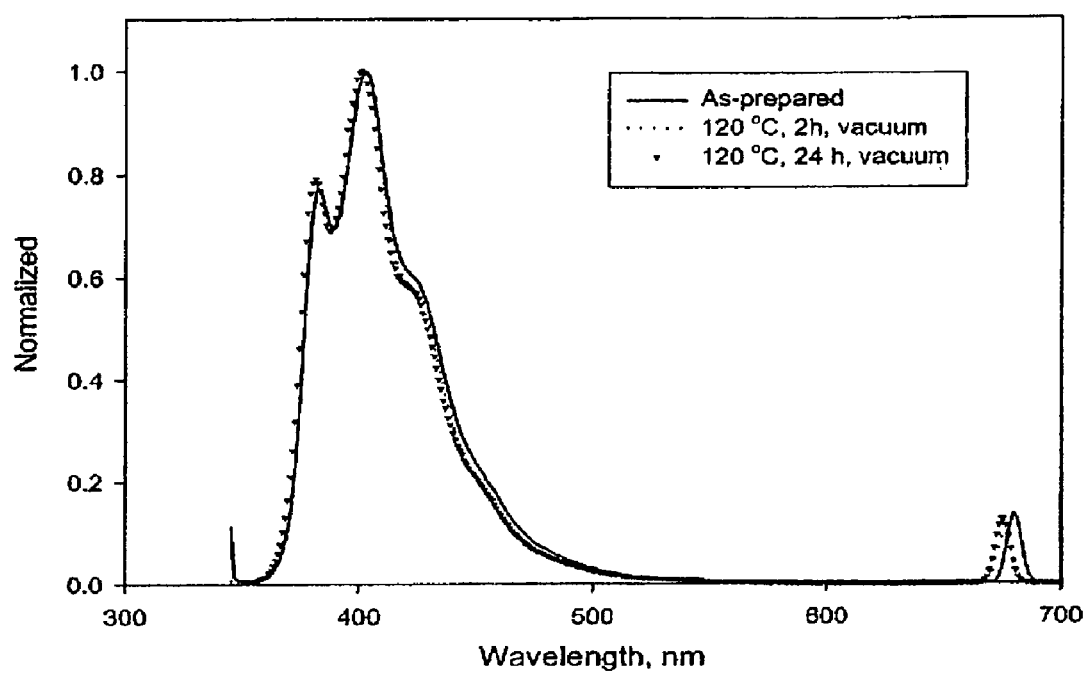
FIG. 19 is the PL spectra of F2BA/PSA films.
Figure 20:
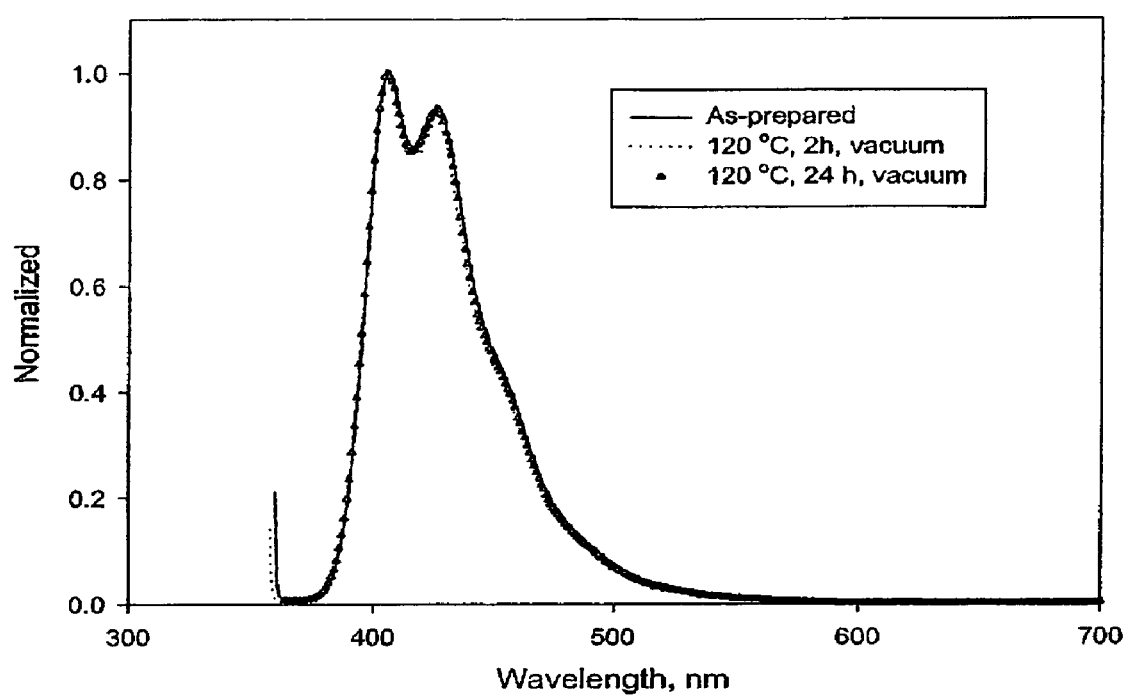
FIG. 20 is the PL spectra of F3BA/PSA films.
Figure 21:
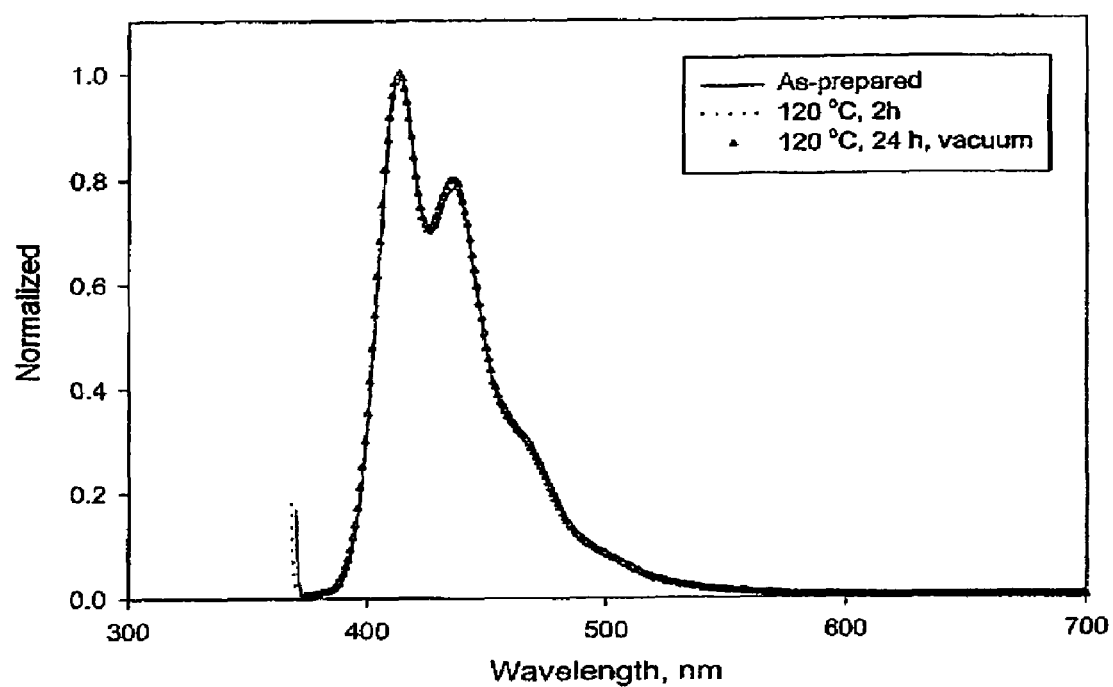
FIG. 21 is the PL spectra of F4BA/PSA films.

PL spectra (FIGS. 19, 20, and 21). The as-prepared films of F2BA/PSA, F3BA/PSA, and F4BA/PSA showed emission peaks (highest) at 403, 406, and 413 nm, respectively, which slightly red-shifted compared to those of the as-prepared films of F2BA (406 nm), F3BA (409 nm), and F4BA (415 nm). The cured films showed no any change in the emission peak positions and shapes within the instrumental error. On the other hand, the cured films of F2BA, F3BA, and F4BA red-shifted 3, 2, and 1 nm in their PL spectra, respectively. The intensity of the emission almost remains the same as the uncured samples, while the films made by self-condensation of FnBA showed reduced intensity after curing. The insulating PSA moieties worked better than the boroxine rings to trap or confine the excitons.

These samples show very thermally stable optical properties with almost no change in their UV-vis and PL spectra after heating at 120° C. for 24 h under vacuum. After heating in the air at 120° C. for 24 h, the UV-vis showed no appreciable changes. The shape of the PL spectra was maintained after heating in the air, but the intensity decrease about one third of the original intensity. However no long wavelength emission was observed. These results indicate that oxidation occurs when these samples were exposed to air at elevated temperature, but the quenching effect is not as strong as observed in polymers with extended conjugation. The isolation of chromophores by insulating PSA might prevent the migration of excitons to the quenching sites generated by oxidation.

CONCLUSION

A novel approach based on the thermal dehydration of oligofluorene diboronic acids via the formation of boroxine linkages has been developed to resolve the problems associated with chain aggregates and/or excimer formation that has often been observed polyfluorenes. The oligofluorene diboronic acids, F2BA, F3BA, and F4BA, were thus designed and synthesized. These compounds are readily soluble in organic solvents such as THF, acetone, and DMF. These compounds can be easily fabricated into uniform thin films by spin-coating from TBF solutions onto glass substrates. These films can then be conveniently cross-linked using mild conditions (60-110° C. under vacuum for 2 h) to form solvent-resistant and thermally stable amorphous polymeric networks ($T_g$, 173-202° C.; $T_d$ at 5% weight loss, 370-420° C.). The absorption and emission spectra of these thin films were also found to be thermally stable, showing no long wavelength emissions after being heated at 120° C. for 24 h. These stable blue light emitting materials would appear to be promising materials for organic emitters in LEDs. The electroluminescence properties of these materials are currently under investigation. It also appears likely that this approach could be applied for hole- and electron-transporting materials in LEDs to stabilize their morphology and electro-optical properties. More importantly, since the crosslinked networks made by this method are insoluble in water alone and in anhydrous organic solvents, they allow the coating of succeeding layers to fabricate super-lattice structures and multi-layered devices.

TABLE 2

Photophysical properties of F$_n$BA/PSA films.

| | $\lambda_{max}$, UV-vis, nm | | | $\lambda_{max}$, Photoluminescence, nm | | |
|---|---|---|---|---|---|---|
| Films | As-pre. | 120° C., 2 h | 120° C., 24 h | As-pre. | 120° C., 2 h | 120° C., 24 h |
| F2BA/PSA | 340 | 338 | 338 | 383, 403 | 383, 403 | 381, 401 |
| F3BA/PSA | 356 | 354 | 354 | 406, 426 | 406, 426 | 405, 426 |
| F4BA/PSA | 366 | 364 | 364 | 413, 436 | 413, 436 | 413, 436 |

Arylamine derivatives CzBA and TPABA were synthesized. These boronic acids readily undergo self-condensation under mild conditions to form solvent-resistant polymeric networks. These materials are potentially applicable as hole-transporting materials in devices such as LEDs.

Esterification of boronic acids F2BA, F3BA, and F4BA with a commercially available polyol PSA were investigated. Esterification of boronic acid groups almost completes after heating at 120° C. for 2 h under vacuum. The crosslinked networks thus formed showed strong solvent-resistance. The spectral stabilities are also improved in respect with those prepared by thermal self-condensation of boronic acids alone, which are attributable to the absence of weakly conjugated boroxine rings in these polymer networks.

Appendix II

Fabrication and Study of Optical and Electronic Transport of the Light Emitting Devices Based on CzBA and F3BA I. Fabrication of Single- and Double-Layer Thin Films Two types of materials containing boronic acid groups have been used for the preliminary study on the possibility of making a multi-layer structure: CzBA (hole transporting) and $F_3BA$ (electron-transporting, light emitting).

The CzBA thin films were spin-coated from a THF solution (20 mg CzBA/ml), at 1500 rpm for 50". The CzBA films prepared under this condition are about 110-120 nm thick. Films were heated in a vacuum oven at 130° C. for two hours to realize cross-link. No thickness change was found after the heat treatment (within 10% of accuracy). Small red shifts were found the UV-vis and fluorescence spectra, but the change in spectra is very small (FIG. 2)

The $F_3BA$ thin films were spin-coated from a TEF solution (20 mg $F_3BA$/ml), at 1500 rpm for 50". The $F_3BA$ films prepared under this condition are about 120-130 nm thick. Films were heated in a vacuum oven at 130° C. for two hours to realize cross-link. No thickness change was found after the heat treatment (within 10% of accuracy). Small red shifts were found the UV-vis and fluorescence spectra. But the change in spectra is very small. One important feature in the FL spectra is that the intensity did not decrease after a thermal treatment in vacuum (FIG. 3). An $F_3BA$ layer was also spin-cast on top of the CzBA thin film. The total thickness of the resulted double layer structure was 250 nm, that is the sum of the thickness of CzBA and $F_3BA$ layers.

Appendix III

Fabrication and study of optical and electronic transport of organic light emitting devices based on CzBA and $F_3BA$ thin films:

ITO coated glass substrates were patterned using conventional photolithography and wet chemical etching. The pixel size is 5 mm×5 mm. Thin films and double layer structure were prepared as described in Appendix I. The three device structures used are illustrated in FIG. 4.

Devices with double layer structure were successfully fabricated using CzBA and $F_3BA$. CzBA layer functioned as a hole-transporting layer, and $F_3BA$ functioned as an emissive and electron-transporting layer. The following are the device performance data of OLEDs based on CzBA and $F_3BA$ double layer structure and $F_3BA$ single layer structure:

At the same electric field strength, the double layer structure device conducts much more electric current (current=hole current+electron current) (See FIG. 5).

At the same electric field strength, the double layer structure device emits more light (See FIG. 6).

At the same electric current density, the double layer structure device emits more light, i.e. the device efficiency is much higher (See FIG. 7).

The electroluminescence spectrum of the CzBA/$F_3BA$ double layer device is identical to the photolumninescence spectrum of $F_3BA$ thin film (peaked at 416 nm). However, the EL spectrum of a single layer $F_3BA$ device is very different from the PL of $F_3BA$ thin film, there is a very broad long-wavelength shoulder beside the fluorene emission peak (See FIG. 8), that might be caused by imbalanced charge injection (electrons>>holes) in the device. In many cases, molecules are much less stable at charged state.

Figure 22:
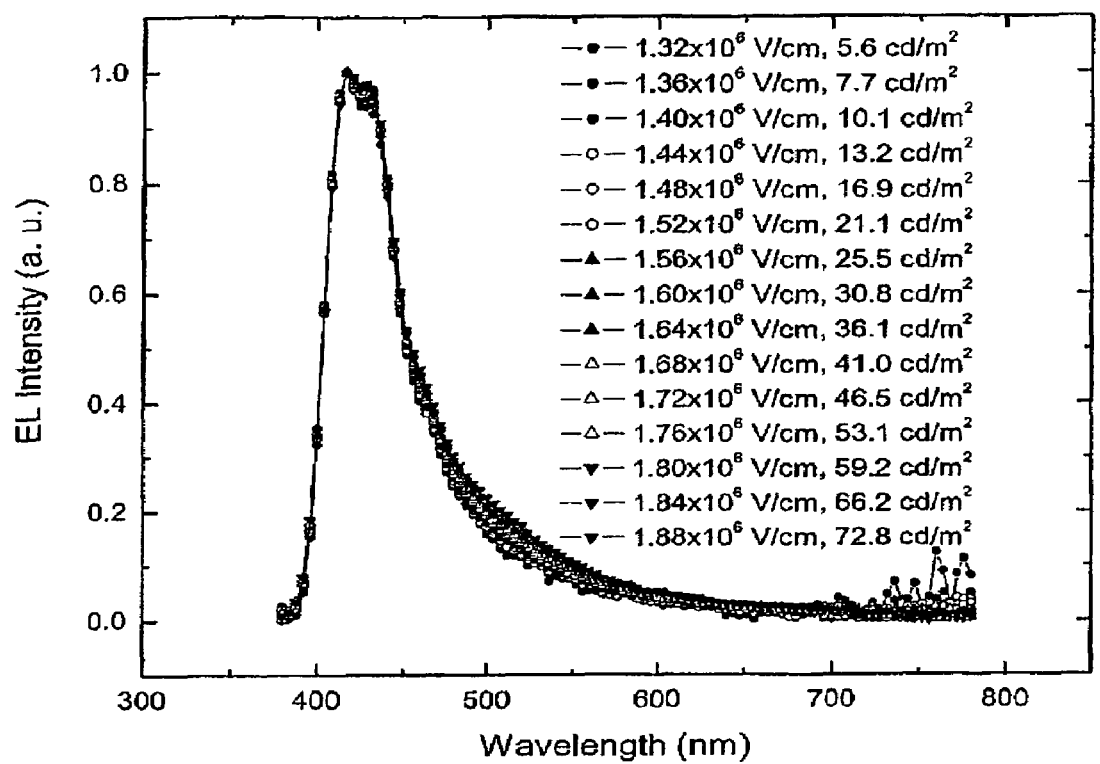
FIG. 22 is a graph illustrating the EL emission at different driving voltages.

This series of experiments demonstrated that a double layer structure has been fabricated successfully using CzBA and $F_3BA$. The hole-transporting layer and electron-transporting layer functioned properly according to the design. That the fluorescence intensity did not decrease after a thermal treatment at 130° C. indicate the cross-link process is useful in enhancing the thermal stability, especially for fluorene-based compounds, which are know thermally unstable. The peak position of the EL emission at different driving voltages remained at 426 nm (See FIG. 22). This is a significant improvement as compared to other polyfluorene based LEDs.

The maximum luminance value recorded for the CzBA/F3BA double layer device is around 170 $cd/m^2$, this is because the luminance meter is calibrated as a photopic response device (See FIG. 9).

REFERENCES

1. Bellmann, E.; Shaheen, S. E.; Thayumanavan, S.; Barlow, S.; Grubbs, R. H.; Marder, S. R.; Kippeen, B.; Peyghambarian, N. *Chem. Mater.* 1998, 10, 1668.
2. Roitman, D. B.; Antoniadis, H.; Hireschen, M. *IEEE J. Sel. Top. Quantum Electron.* 1998, 4 (1), 58.
3. Carey, R. I.; Folkers, J. P.; Whitesides, G. M. *Langmuir* 1994, 10, 2228-2234.
4. (a) Jenekhe, S. A.; Osaheni, J. A. *Science* 1994, 265, 765. (b) Samuel, I. D. W.; Rumbles, G.; Collison, C. J. *Phys. Rev. B.* 1995, 52, R11573. (c) Lee, J.-I.; Klärner, G.; Miller, R. D. *Chem. Mater.* 1999, 11, 1083.
5. (a) Hubber, J.; Müllen, K.; Salbeck, J.; Schenk, H.; Scherf, U.; Stehlin, T.; Stern, R. *Acta Polym.* 1994, 45, 244. (b) Lemmer, U.; Heun, S.; Mahrt, R. F.; Scherf, U.; Hopmeier, M.; Sieger, U.; Göbel, E. O.; Müllen, K.; Bässler, H. *Chem. Phys. Lett.* 1995, 240, 373. (c) Grell, M.; Bradley, D. D. C.; Ungar, G.; Hill, J.; Whitehead, K. S. *Macromolecules* 1999, 32, 5810. (d) Grell, M.; Bradley, D. D. C.; Long, X.; Chamberlain, T.; Inbasekaran, M.; Woo, E. P.; Soliman, M. *Acta Polym.* 1998, 49, 439-444. (e) Kreyeschmidt, M.; Klärner, G.; Fuhrer, T.; Ashenhurst, J.; Karg, S.; Chen, W. D.; Lee, V. Y.; Scott, J. C.; Miller, R. D. *Macromolecules* 1998, 31, 1099.
6. M. Bernius, M. Inbasekaran, E. Woo, W. S. Wu, and L, Wujkowski, Journal of Materials Science Materials in Electronics 11, 111-116 (2000).
7. F. Santerre, I. Bedja, J. P. Dodelet, Y. Sun, J. Lu, A. S. Hay, and M. D'Iorio, Chem, Mater. 13, 1739-1745 (2001).
8. J. P. Lu, K. Miyatake, A. R. Hlil, and A. S. Hay, Macromolecules 34, 5860-5867 (2001).
9. V. Jousseaume, T. Maindron, Y. Wang, J. P. Dodelet, J. Lu, A. R. Hlil, A. S. Hay, and M. D'Iorio, Thin Solid Films sumitted (2002).
10. T. F. Guo, S. Pyo, S. C. Chang, and Y. Yang, Adv. Funct. Mater. 11, 339-343 (2001).
11. G. Klarner, J. I. Lee, V. Y. Lee, E. Chan, J. P. Chen, A. Nelson, D. Markiewicz, R. Siemens, J. C. Scott, and R. D. Miller, Chem, Mater. 11, 1800-1805 (1999).

12. J. P. Chen, G. Klaerner, J. I. Lee, D. Markiewicz, V. Y. Lee, R. D. Miller, and J. C. Scott, Synth. Met. 107, 129-135 (1999).
13. D. Marsitzky, J. Murray, J. C. Scott, and K. Carter, Chem. Mater. 13, 4285-4289 (2001).
14. H. Murata, Synth. Met. 121, 1679 (2001)
15. (a) Setayesh, S.; Grimsdale, A. C.; Weil, T.; Enkermann, V.; Müllen, K.; Meghdadi, F.; List, E. J. W.; Leising, G. J. Am. Chem. Soc. 2001, 123, 946-953. Marsitzky, D.; Vestbert, R.; Blainey, P.; Tang, B. T.; Hawker, C. J.; Carter, K. R. J. Am. Chem. Soc. 2001, 123, 6965. (b) Tang, H. Z.; Fujiki, M.; Zhang, Z. B.; Torimitsu, K.; Motonaga, M. Chem. Commun. 2001, 2426-2427. (c) Geng, Y.; Katsis, D.; Culligan, S. W.; Ou, J. J.; Chen, S. H.; Rothberg, L. J. Chem. Mater. 2002, 14, 463. (d) Zhan, X.; Liu, Y.; Xia, W.; Wang, S.; Zhu, D. Macromolecules 2002, 35, 2529. (e) Klärner, G.; Miller, R. D.; Hawker, C. J. Polym. Prep. 1998, 1006. (f) Lee, J.-I.; Klärner, G.; Chen, J. P.; Scott, J. C.; Miller, R. D. SPIE. Int. Soc. Opt. Eng. 1999, 3623, 2.
16. (a) Kreyenschmidt, M.; Klärner, G.; Fuhrer, T.; Aschenhurst, J.; Karg, S.; Chen, W. D.; Lee, V. Y.; Scott, J. C.; Miller, R. D. Macromolecules 1998, 31, 1099. (b) Klärner, G.; Davey, M. H.; Chen, W. D.; Scott, J. C.; Miller, R. D. Adv. Mater. 1998, 10, 993. (c) Xia, C.; Advincula, R. C. Macromolecules 2001, 34, 5854. (d) Tirapattur, S.; Belletete, M.; Drolet, N.; Leclerc, M.; Durocher, G. Macromolecules 2002, in press.
17. Yu, W. L.; Pei, J.; Huang, W.; Heeger, A. J. Adv. Mater. 2000, 12, 828.
18. (a) Klärner, G.; Lee, J.-I.; Lee, V. Y.; Chan, E.; Chen, J.-P.; Nelson, A.; Markiewicz, D.; Siemens, R.; Scott, J. C.; Miller, R. D. Chem. Mater. 1999, 11, 1800-1805. (b) Marsitzky, D.; Murray, J.; Scott, J. C.; Carter, K. R. Chem. Mater. 2001, 13, 4285-4289.
19. Vevalainen, V.; Mansikka, T.; Kostiainen, R.; Simpura, R.; Kokkonen, J. Tetrahedron-Assym. 1999, 10, 1-5.
20. Morgan, A. B.; Jurs, J. L.; Your, J. M. Polym. Prep. 1999, 40 (2), 553-554.
21. Lappert, M. F. Chem. Rev. 1956, 56, 959-1064.
22. Torsell, K. Prog. Boron Chem. 1964, 1, 369-400.
23. Onak, T. Organoboron Chemistry; Academic Press, New York, 1975.

The invention claimed is:

1. A cross-linked composite of a boronic acid of structural formula I or a boronate of structural formula II having a functionality selected from hole transporting, electron transporting, light emitting and a mixture thereof, and a di-or polyol or thiol of structural formula III,

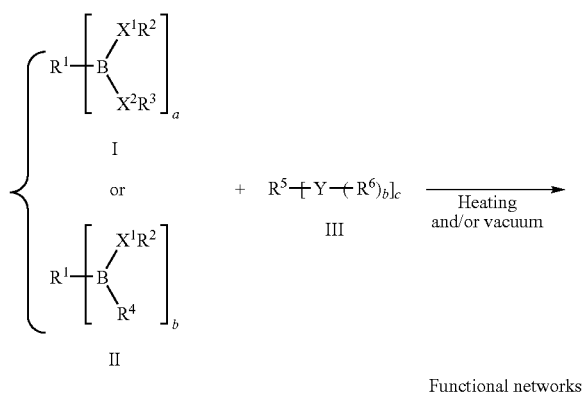

Functional networks wherein $R^1$, $R^4$ and $R^5$ are alkyl or aryl, at least one of them containing a functionality;
$R^2$ and $R^3$ are alkyl or aryl,
$R^6$ is H,
$X^1$ and $X^2$ are O,
Y is O or S, and
a, b, and c are equal to or larger than one, but at least one of a, b and c is larger than one.

2. A cross-linked composite according to claim 1, wherein the functionality is a mixture of such functionalities having a different functionality.

3. A multi-layer material comprising a plurality of layers of a cross-linked composite as defined in claim 1, having a functionality selected from hole transporting, electron transporting, light emitting and a mixture thereof, wherein each layer has a different functionality.

4. A multi-layer material according to claim 3, having two functional layers, one functional layer having a hole transporting functionality, and the other functional layer having a light emitting functionality and an electron transporting functionality.

5. A multi-layer material according to claim 4, wherein the layer having the hole transporting functionality comprises CzBA, and wherein the layer having the light emitting functionality and an electron transporting functionality is $F_nBA$, wherein n=2, 3 or 4.

6. A method of making a multi-layer material comprising a plurality of layers of a cross-linked composite as defined in claim 1, having a functionality selected from hole transporting, electron transporting, light emitting and a mixture thereof, the method comprising forming on a substrate, a layer of the composite and cross-linking, and forming at least one other such layer having a different functionality selected from hole transporting, electron transporting, light emitting, and a mixture thereof, and cross-linking.

7. A method according to claim 6, wherein said layer is formed on the substrate by spin coating from solution in an organic solvent and cross-linked, and successively forming and cross-linking said at least one other such layer.

8. A method according to claim 7, wherein the organic solvent is selected from the group consisting of THF, DMF and acetone.

9. A multi-layer photoelectronic device, comprising in sequence, a transparent substrate layer, a transparent electrode layer, a layer of a transparent cross-linked composite as defined in claim 1, having a functionality selected from hole transporting, electron transporting, light emitting and a mixture thereof, at least one another such cross-linked composite layer having a different functionality selected from hole transporting, electron transporting, light emitting and a mixture thereof, and another electrode layer.

10. A multi-layer photoelectronic device according to claim 9, having two functional layers, one functional layer having a hole transporting functionality, and the other functional layer having a light emitting functionality and an electron transporting functionality.

11. A multi-layer photoelectronic device according to claim 10, wherein the layer having the hole transporting functionality comprises CzBA, and wherein the layer having the light emitting functionality and an electron transporting functionality is $F_nBA$, wherein n=2, 3 or 4.

12. A multi-layer photoelectronic device according to claim 11, wherein the transparent substrate is glass, the transparent electrode is indium tin oxide and the another electrode layer is Mg:Ag.

13. A method of making a cross-linked composite of a boronic acid of structural formula I or II (when $R^2$ and $R^3$=H)

or a boronate of structural formula I or II (when $R^2$ and $R^3$=alkyl or aryl) having a functionalilty selected from hole transporting, electron transporting, light emitting and a mixture thereof, and a di- or polyol or thiol of structural formula III, comprising reacting a compound of structural formula I or structural formula II with a compound of structural formula III, and cross-linking according to the following reaction

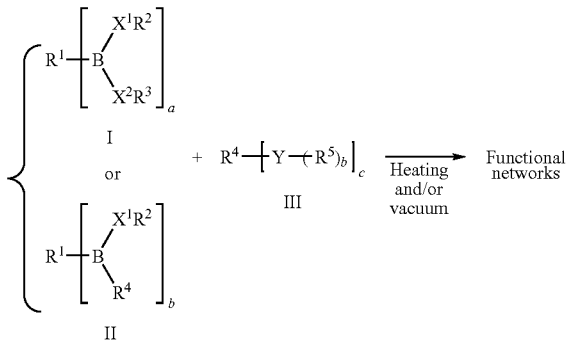

wherein, $R^1$, $R^4$ and $R^5$ are alkyl or aryl, at least one of them containing a functionality;

$R^2$ and $R^3$ are alkyl or aryl, $R^6$ is H, $X^1$ and $X^2$ are O,

Y=O or S, and a, b, and c are equal to or larger than one, but at least one of a, b and c is larger than one.

14. A method according to claim 13, wherein the functionality is a mixture of such functionalities having a different functionality.

15. A method according to claim 13, wherein the cross-linking is effected by heating under vacuum.

16. A method according to claim 15, wherein heating is effected at a temperature of from room temperature up to 130° C.

17. A cross-linked functional network, made by a method as claimed in claim 15.

* * * * *